(12) United States Patent
Takahashi et al.

(10) Patent No.: US 7,083,892 B2
(45) Date of Patent: *Aug. 1, 2006

(54) RESIST COMPOSITION

(75) Inventors: Hyou Takahashi, Shizuoka (JP); Shoichiro Yasunami, Shizuoka (JP); Kazuyoshi Mizutani, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/606,845

(22) Filed: Jun. 27, 2003

(65) Prior Publication Data

US 2004/0005513 A1  Jan. 8, 2004

(30) Foreign Application Priority Data

Jun. 28, 2002 (JP) .................... P. 2002-190581

(51) Int. Cl.
*G03F 7/004* (2006.01)
(52) U.S. Cl. .................. 430/270.1; 430/281.1; 430/286.1; 430/326
(58) Field of Classification Search ............ 430/270.1, 430/281.1, 286.1, 326
See application file for complete search history.

(56) References Cited

U.S. PATENT DOCUMENTS

| 5,731,364 | A | 3/1998 | Sinta et al. | |
|---|---|---|---|---|
| 6,238,842 | B1 * | 5/2001 | Sato et al. | 430/281.1 |
| 6,258,507 | B1 * | 7/2001 | Ochiai et al. | 430/270.1 |
| 6,387,590 | B1 * | 5/2002 | Mizutani et al. | 430/270.1 |
| 6,406,830 | B1 * | 6/2002 | Inoue et al. | 430/270.1 |

OTHER PUBLICATIONS

U.S. Appl. No. 10/361,505, filed on Feb. 11, 2003.*
U.S. Appl. No. 10/613,044, filed on Jul. 7, 2003.*
U.S. Appl. No. 10/654,942, filed on Sep. 5, 2003.*

* cited by examiner

*Primary Examiner*—Hoa Van Le
(74) *Attorney, Agent, or Firm*—Sughrue Mion, PLLC

(57) ABSTRACT

The resist composition of the present invention, ensuring excellent pattern profile and excellent isolation performance for use in the pattern formation by the irradiation of actinic rays or radiation, particularly, electron beam, X ray or EUV light, which comprising (A) a compound having a specific partial structure and a counter ion, the compound generating an acid upon irradiation of actinic rays or radiation.

12 Claims, No Drawings

RESIST COMPOSITION

FIELD OF THE INVENTION

The present invention relates to a resist composition suitable for use in the microlithography process such as production of VLSI or high-capacity microchip, or other fabrication processes. More specifically, the present invention relates to a resist composition capable of forming a highly refined pattern using electron beam, X ray or EUV light.

BACKGROUND OF THE INVENTION

In the production process of semiconductor devices such as IC and LSI, fine processing has been conventionally performed using a resist composition or by lithography. In recent years, accompanying higher integration of integrated circuits, formation of an ultrafine pattern in the sub-micron or quarter-micron region is being demanded. Along with this requirement, the exposure wavelength is becoming shorter, for example, changing from g line to i line or even to KrF excimer laser light. Furthermore, studies on lithography using electron beam, X ray or EUV light other than excimer laser light are proceeding at present.

Particularly, the electron beam lithography is expected as a next-generation or second next-generation pattern forming technique and a high-sensitivity and high-resolution resist is being demanded.

As the resist suitable for such an electron beam or X-ray lithography process, a chemical amplification-type resist utilizing mainly an acid catalytic reaction is used from the standpoint of attaining higher sensitivity.

Various studies have been heretofore made to improve the performance of chemical amplification-type resist and particularly, from the aspect of acid generator, the following studies have been made. For example, JP-B-8-3635 (the term "JP-B" as used herein means an "examined Japanese patent publication") discloses organic halogen compounds, JP-A-2-52348 (the term "JP-A" as used herein means an "unexamined published Japanese patent application") discloses aromatic compounds substituted by Br or Cl, JP-A-4-367864 and JP-A-4-367865 disclose aromatic compounds having an alkyl or alkoxy group substituted by Br or Cl, JP-A-3-87746 discloses haloalkane sulfonate compounds, JP-A-6-199770 discloses iodonium or sulfonium compounds, Japanese Patent 2,968,055 discloses trifluoromethane-sulfonate compounds having a phenolic hydroxy group, and JP-A-2001-142200 discloses specific benzenesulfonate compounds having a phenolic hydroxy group.

However, any combination of these compounds fails in satisfying both good pattern profile in the ultrafine region and good isolation performance.

SUMMARY OF THE INVENTION

An object of the present invention relates to a resist composition satisfying both requirements for good pattern profile and good isolation performance in the fine processing of a semiconductor device using actinic rays or radiation, particularly, electron beam, X ray or EUV light.

As a result of extensive investigations, the present inventors have found that the above-described object can be attained by using an acid generator having a specific structure. The present invention has been accomplished based on this finding.

More specifically, the present invention is composed of the following constitutions.

(1) A negative resist composition comprising:

(A) a compound generating an acid upon irradiation with actinic rays or radiation, the compound having: a partial structure represented by the following formula (1); and a counter ion;

(B) an alkali-soluble resin; and (C) a crosslinking agent of undergoing an addition reaction with the alkali-soluble resin (B) under the action of an acid, wherein the composition comprises the compound (A) in an amount of from 3.6 to 15 wt % based on the solid content of the composition:

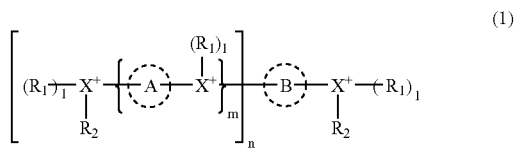

wherein X represents a sulfur atom or an iodine atom and the plurality of Xs may be the same or different, $R_1$ and $R_2$ each independently represents an alkyl group which may have a substituent, or an aryl group which may have a substituent; when a plurality of $R_1$s are present, the plurality of $R_1$s may be the same or different; the plurality of $R_2$s may be the same or different; and $R_1$ and $R_2$ may combine to form a ring, A and B each independently represents a hydrocarbon structure connecting between $X^+$s, and at least two of $X^+$s connected with B are in a conjugated system ; and when a plurality of As are present, the plurality of As may be the same or different, l represents 0 or 1, and, when X is a sulfur atom, l parenthesizing $R_1$ connected to $X^+$ is 1 and when X is an iodine atom, l parenthesizing $R_1$ connected to $X^+$ is 0, m represents an integer of 0 to 10, and n represents an integer of 1 to 5.

(2) A positive resist composition comprising:

(A) a compound generating an acid upon irradiation with actinic rays or radiation, the compound having: a partial structure represented by the following formula (1); and a counter ion; and (D) a resin capable of increasing in the solubility in an alkali developer under the action of an acid, wherein the composition comprises the compound (A) in an amount of from 3.6 to 15 wt % based on the solid content of the composition:

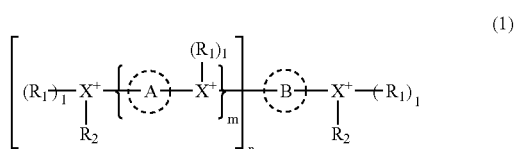

wherein X represents a sulfur atom or an iodine atom and the plurality of Xs may be the same or different, $R_1$ and $R_2$ each independently represents an alkyl group which may have a substituent, or an aryl group which may have a substituent; when a plurality of $R_1$s are present, the plurality of $R_1$s may be the same or different; the plurality of $R_2$s may be the same or different; and $R_1$ and $R_2$ may combine to form a ring, A and B each independently represents a hydrocarbon structure connecting between $X^+$s, and at least two of $X^+$s connected with B are in a conjugated system; and when a plurality of As are present, the plurality of As may be the same or different, l represents 0 or 1, and, when X is a sulfur atom, l parenthesizing $R_1$ connected to $X^+$ is 1 and when X is an iodine atom, l parenthesizing $R_1$ connected to $X^+$ is 0, m represents an integer of 0 to 10, and n represents an integer of 1 to 5.

(3) The positive resist composition as described in the item (2), wherein the resin (D) is (D1) a resin capable of increasing in the solubility in an alkali developer under the action of an acid, the resin (D1) having a repeating unit represented by the following formula (IV) and a repeating unit represented by the following formula (V):

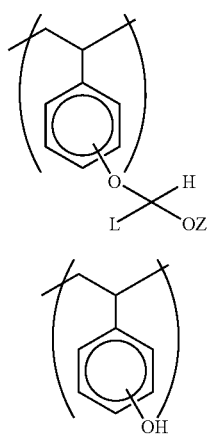

(IV)

(V)

wherein L represents a hydrogen atom, a linear, branched or cyclic alkyl group which may be substituted, or an aralkyl group which may be substituted, Z represents a linear, branched or cyclic alkyl group which may be substituted, or an aralkyl group which may be substituted, and Z and L may combine to form a 5- or 6-membered ring.

(4) The positive resist composition as described in the item (3), wherein the molar ratio of the repeating unit represented by formula (IV) to the repeating unit represented by formula (V) is (IV)/(V)=10/90 to 40/60.

(5) The negative resist composition as described in the item (1), which further comprises (F) a nitrogen-containing basic compound.

(6) The positive resist composition as described in the item (2), which further comprises (F) a nitrogen-containing basic compound.

(7) The negative resist composition as described in the item (1), wherein the counter ion in the compound (A) is one of an anion of an aliphatic sulfonic acid and an anion of an aromatic sulfonic acid.

(8) The negative resist composition as described in the item (7), wherein the anion of an aliphatic sulfonic acid and an anion of an aromatic sulfonic acid contain a fluorine atom as a substituent.

(9) The positive resist composition as described in the item (2), wherein the counter ion in the compound (A) is one of an anion of an aliphatic sulfonic acid and an anion of an aromatic sulfonic acid.

(10) The positive resist composition as described in the item (9), wherein the anion of an aliphatic sulfonic acid and an anion of an aromatic sulfonic acid contain a fluorine atom as a substituent.

(11) The negative resist composition as described in the item (1), wherein in the formula (1), B is a benzene ring, n is 1 and m is 0.

(12) The positive resist composition as described in the item (2), wherein in the formula (1), B is a benzene ring, n is 1 and m is 0.

(13) The negative resist composition as described in the item (1), wherein in the formula (1), the hydrocarbon structure of A is a hydrocarbon structure having: from 4 to 16 carbon atoms; a single bond consisting of (carbon-carbon) bond; and one of a double bond and a triple bond, and the hydrocarbon structure may have an oxygen atom or a sulfur atom.

(14) The negative resist composition as described in the item (1), wherein in the formula (1), the hydrocarbon structure of B is a conjugated hydrocarbon structure having: from 4 to 16 carbon atoms; a single bond (carbon-carbon) bond; and one of a double bond and a triple bond, and the hydrocarbon structure may have an oxygen atom or a sulfur atom.

(15) The negative resist composition as described in the item (1), wherein in the formula (1), the hydrocarbon structure of A is one of the followings:

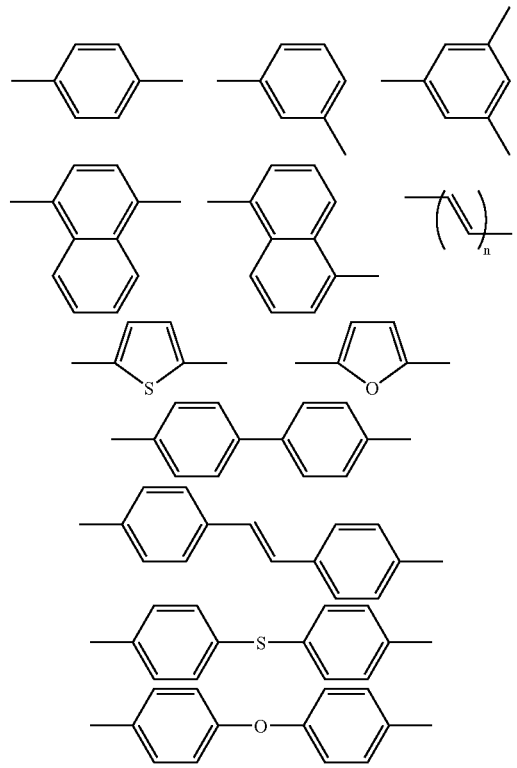

(16) The negative resist composition as described in the item (1), wherein in the formula (1), the hydrocarbon structure of B is one of the followings:

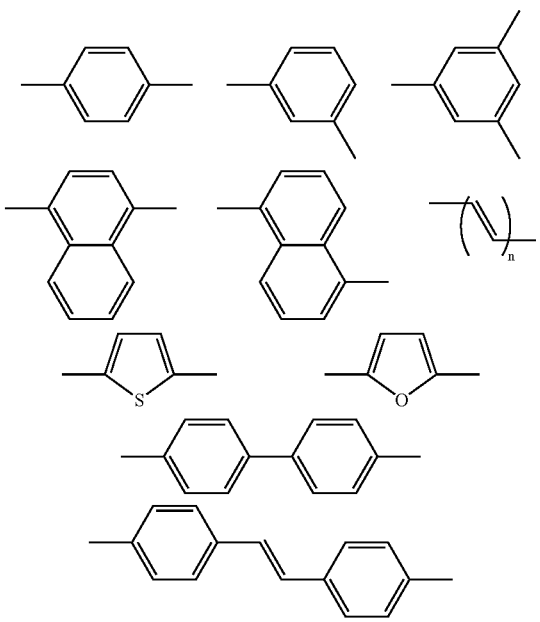

(17) The positive resist composition as described in the item (2), wherein in the formula (1), the hydrocarbon structure of A is a hydrocarbon structure having: from 4 to 16 carbon atoms; a single bond consisting of (carbon-carbon) bond; and one of a double bond and a triple bond, and the hydrocarbon structure may have an oxygen atom or a sulfur atom.

(18) The positive resist composition as described in the item (2), wherein in the formula (1), the hydrocarbon structure of B is a conjugated hydrocarbon structure having: from 4 to 16 carbon atoms; a single bond (carbon-carbon) bond; and one of a double bond and a triple bond, and the hydrocarbon structure may have an oxygen atom or a sulfur atom.

(19) The positive resist composition as described in the item (2), wherein in the formula (1), the hydrocarbon structure of A is one of the followings:

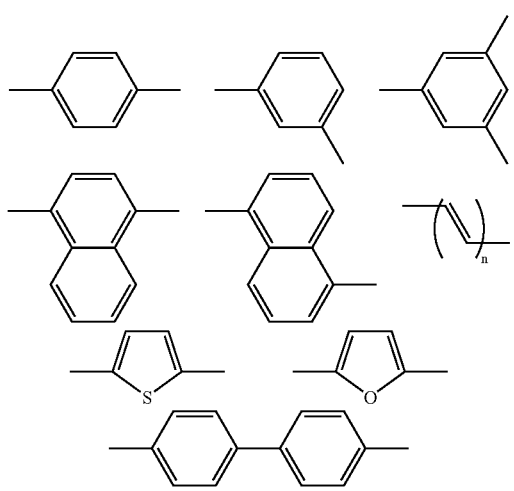

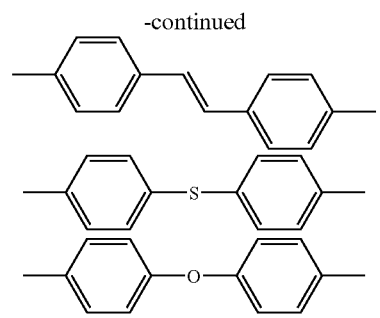

(20) The positive resist composition as described in the item (2), wherein in the formula (1), the hydrocarbon structure of B is one of the followings:

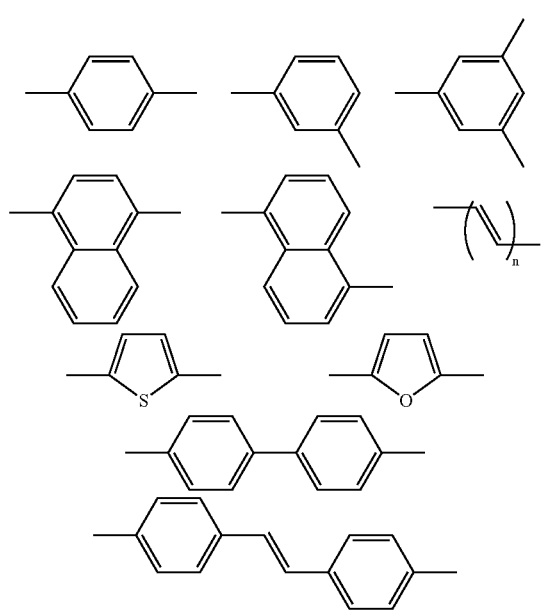

(21) A positive resist composition comprising:

(A) a compound generating an acid upon irradiation with actinic rays or radiation, the compound having: a partial structure represented by the following formula (1); and a counter ion;

(B) an alkali-soluble resin; and (C) a compound capable of increasing in the solubility in an alkali developer under the action of an acid, wherein the composition comprises the compound (A) in an amount of from 3.6 to 15 wt % based on the solid content of the composition:

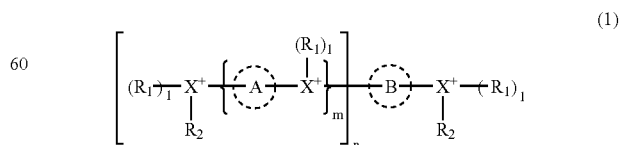

wherein X represents a sulfur atom or an iodine atom and the plurality of Xs may be the same or different, $R_1$ and $R_2$ each independently represents an alkyl group which may have a substituent, or an aryl group which may have a substituent; when a plurality of $R_1$s are present, the plurality of $R_1$s may be the same or different; the plurality of $R_2$s may be the same or different; and $R_1$ and $R_2$ may combine to form a ring, A and B each independently represents a hydrocarbon structure connecting between $X^+$s, and at least two of $X^+$s connected with B are in a conjugated system ; and when a plurality of As are present, the plurality of As may be the same or different, l represents 0 or 1, and, when X is a sulfur atom, l parenthesizing $R_1$ connected to $X^+$ is 1 and when X is an iodine atom, l parenthesizing $R_1$ connected to $X^+$ is 0, m represents an integer of 0 to 10, and n represents an integer of 1 to 5.

DETAILED DESCRIPTION OF THE INVENTION

The present invention is described in detail below.

The resist composition of the present invention is characterized by comprising a compound having a partial structure represented by formula (1) and a counter ion, which generates an acid upon irradiation with actinic rays or radiation.

The resist composition of the present invention may be either a negative resist composition or a positive resist composition.

The negative resist composition of the present invention comprises a compound having a partial structure represented by formula (1) and a counter ion, which generates an acid upon irradiation with actinic rays or radiation, an alkali-soluble resin and a crosslinking agent of undergoing an addition reaction with the alkali-soluble resin under the action of an acid.

The positive resist composition of the present invention comprises a compound having a partial structure represented by formula (1) and a counter ion, which generates an acid upon irradiation with actinic rays or radiation, and a resin capable of increasing in the solubility in an alkali developer under the action of an acid, or comprises a compound having a partial structure represented by formula (1) and a counter ion, which generates an acid upon irradiation with actinic rays or radiation, an alkali-soluble resin and a dissolution inhibiting compound capable of increasing in the solubility in an alkali developer under the action of an acid.

[1] (A) Compound Having a Partial Structure Represented by Formula (1) and a Counter Ion, Which Generates an Acid Upon Irradiation with Actinic Rays or Radiation The resist composition of the present invention comprises a compound having a partial structure represented by formula (1) and a counter ion, which generates an acid upon irradiation with actinic rays or radiation (hereinafter sometimes referred to as an "acid generator (A)").

In formula (1), X represents a sulfur atom or an iodine atom. The plurality of Xs may be the same or different. $R_1$ and $R_2$ each independently represents an alkyl group which may have a substituent, or an aryl group which may have a substituent. When a plurality of $R_1$s are present, the plurality of $R_1$s may be the same or different. The plurality of $R_2$s may be the same or different. Also, $R_1$ and $R_2$ may combine to form a ring. A and B each independently represents a hydrocarbon structure connecting X and X, provided that at least two of $X^+$s connected with B are in a conjugated system. When a plurality of As are present, the plurality of As may be the same or different. l represents 1, provided that when X is a sulfur atom, l parenthesizing $R_1$ connected to X is 1 and when X is an iodine atom, l parenthesizing $R_1$ connected to X is 0. m represents an integer of 0 to 10 and n represents an integer of 1 to 5.

The alkyl group of $R_1$ and $R_2$ is preferably an alkyl group having a carbon number of 1 to 8 and may be any of a linear alkyl group, a branched alkyl group and a cyclic alkyl group. Examples thereof include a methyl group, an ethyl group, a propyl group, an isopropyl group, a butyl group, an isobutyl group, a tert-butyl group, a pentyl group, a neopentyl group, a hexyl group, a heptyl group, an octyl group, a cyclopropyl group, a cyclobutyl group, a cyclopentyl group, a cyclohexyl group, a norbornyl group and an adamantyl group.

The aryl group of $R_1$ and $R_2$ is preferably an aryl group having a carbon number of 6 to 16 and examples thereof include a phenyl group, a naphthyl group, an anthranyl group, a phenanthrenyl group and a pyrenyl group.

The hydrocarbon structure connecting $X^+$s of A is preferably a hydrocarbon structure having from 4 to 16 carbons and is constituted by a combination of a single bond consisting of (C to C) bonding, and a conjugated bond comprising a double bond or a triple bond, in which the structure may have an oxygen atom or a sulfur atom. The hydrocarbon structure connecting $X^+$s of A is preferably conjugated structure, more preferably aromatic structure. Specific preferred examples of the hydrocarbon structure include the following structure:

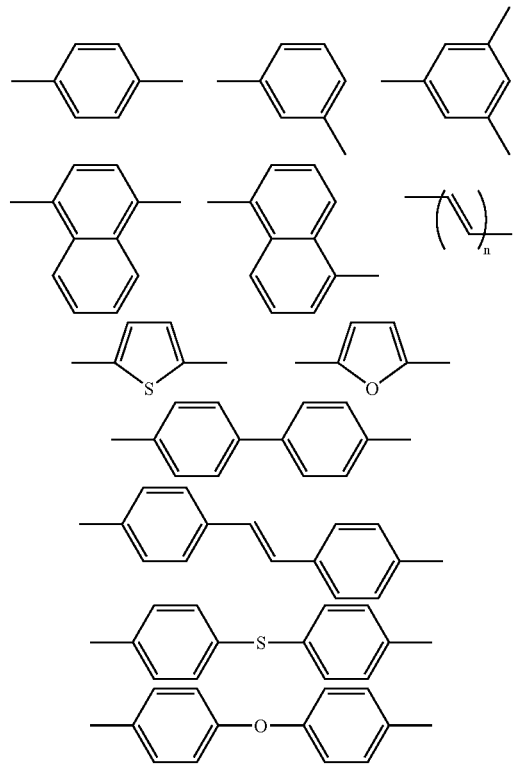

The hydrocarbon structure connecting $X^+$s of B is preferably a hydrocarbon structure that has from 4 to 16 carbons and is a conjugated structure that is constituted by a combination of a single bond consisting of (C to C) bonding, and a conjugated bond comprising a double bond or a triple bond, in which the structure may have an oxygen atom or a sulfur atom. The hydrocarbon structure connecting X⁺s of B is preferably an aromatic structure. Specific preferred examples of the hydrocarbon structure include the following structure:

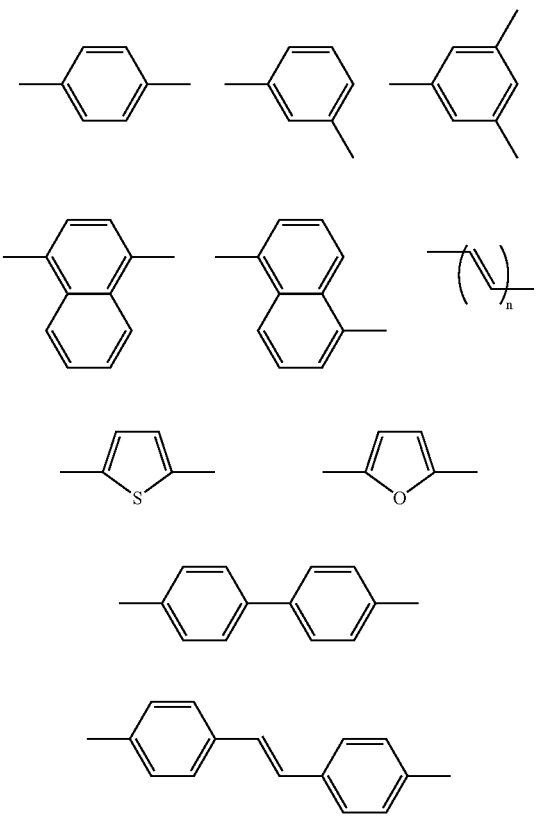

The phrase: "at least two of X⁺s connected with B are in a conjugated system", means that B connecting the at least two of X⁺s is in a state, in which a multiple bond is linked each other via only one single bond and interacts with each other, that is, has a conjugated structure.

$R_1$, $R_2$ and A and B each may have a substituent and examples of the substituent include a fluorine atom, a chlorine atom, a bromine atom, an iodine atom, a linear or branched alkyl group having a carbon number of 1 to 5, a cyclic alkyl group having a carbon number of 3 to 8, a linear or branched fluorine-substituted alkyl group having a carbon number of 1 to 3, a hydroxyl group, a thiol group, an alkyloxy group having a carbon number of 1 to 5, a nitro group, a cyano group, a formyl group, a phenyl group, a naphthyl group, a phenylthio group and a phenoxy group.

The compound having a partial structure represented by formula (1), which generates an acid upon irradiation with actinic rays or radiation, has a counter ion together with the partial structure.

Examples of the counter ion include aliphatic sulfonate anion, aromatic sulfonate anion, aliphatic carboxylate anion and aromatic carboxylate anion.

The aliphatic group in the aliphatic sulfonate anion and aliphatic carboxylate anion is preferably an aliphatic group having a carbon number of 1 to 30 and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group.

The aromatic group in the aromatic sulfonate anion and aromatic carboxylate anion is preferably an aromatic group having a carbon number of 6 to 30 and examples thereof include a phenyl group, a tolyl group and a naphthyl group.

These aliphatic sulfonate anion, aromatic sulfonate anion, aliphatic carboxylate anion and aromatic carboxylate anion each may have a substituent.

Examples of the substituent include a halogen atom such as fluorine, an alkyl group, an alkoxy group and an alkylthio group.

The aliphatic sulfonate anion, aromatic sulfonate anion, aliphatic carboxylate anion and aromatic carboxylate anion each preferably has a fluorine atom as the substituent. In the acid generator (A), it is preferred that A and B both are an aromatic ring, and it is more preferred that B is a benzene ring, n=1 and m=0.

Specific examples of the compound having a partial structure represented by formula (1), which generates an acid upon irradiation with actinic rays or radiation, are set forth below, however, the present invention is not limited thereto.

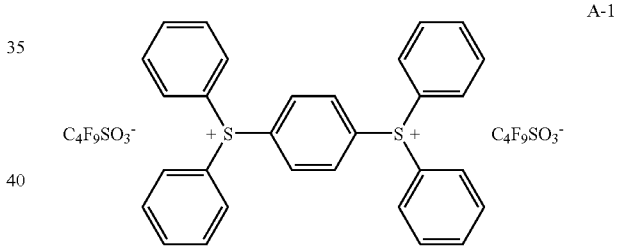

A-1

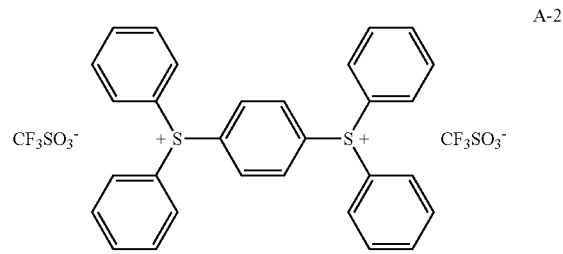

A-2

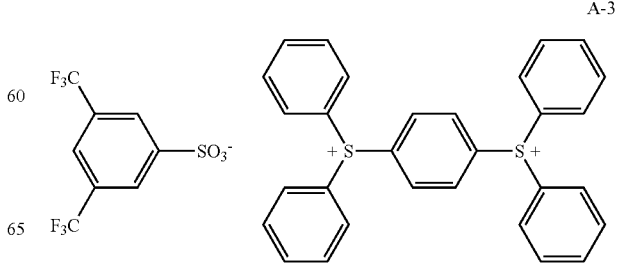

A-3

-continued
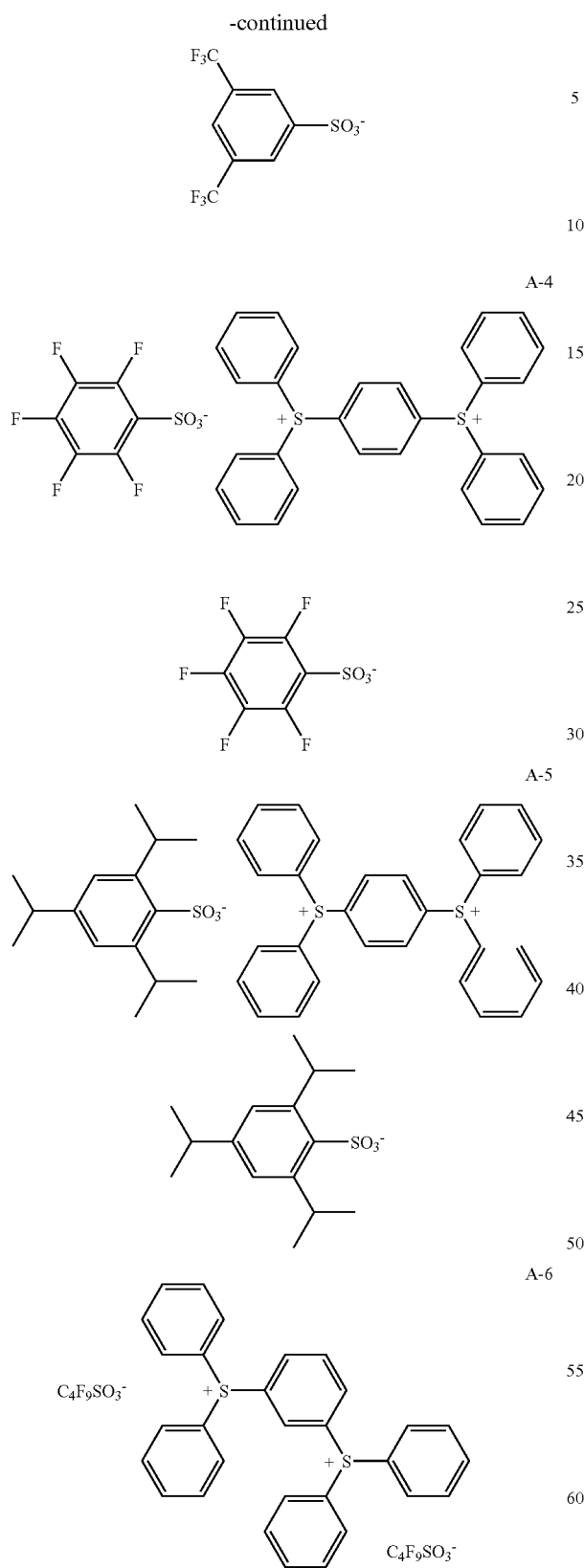
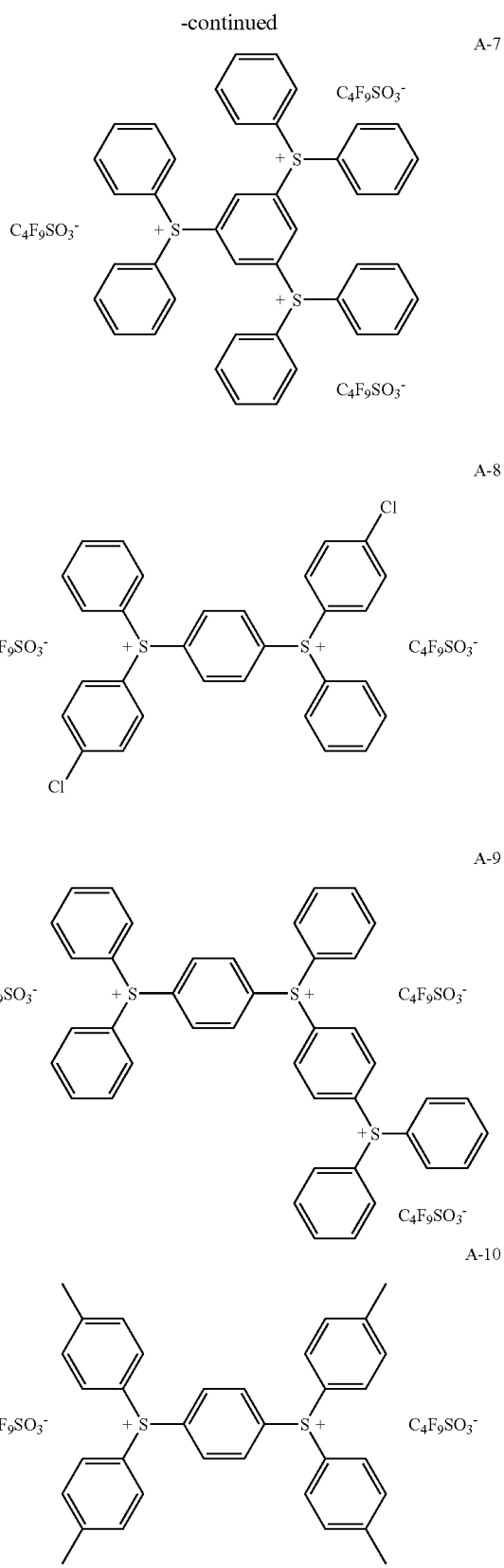

-continued

A-12
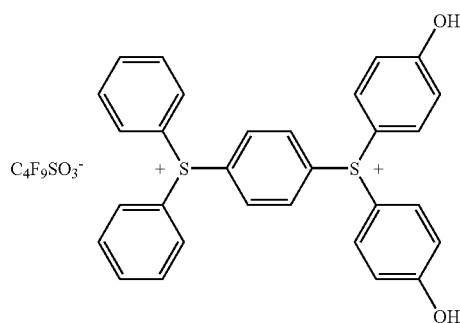

A-13
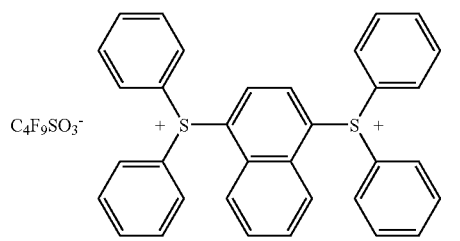

A-14
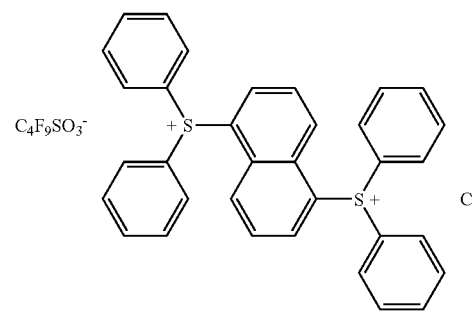

A-15
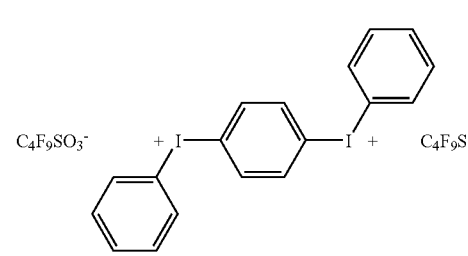

A-16
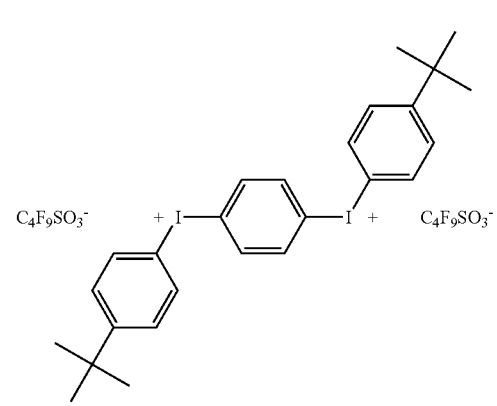

-continued

A-17
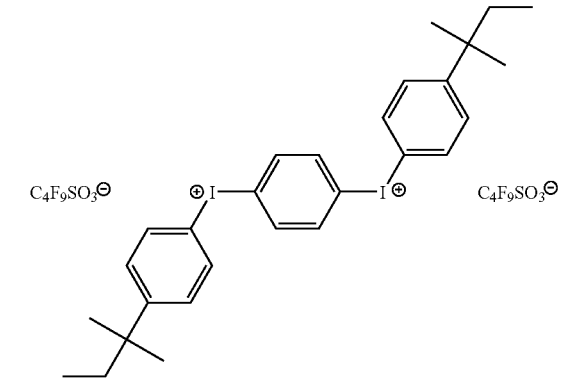

A-18
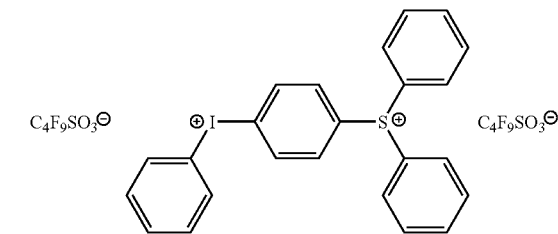

A-19
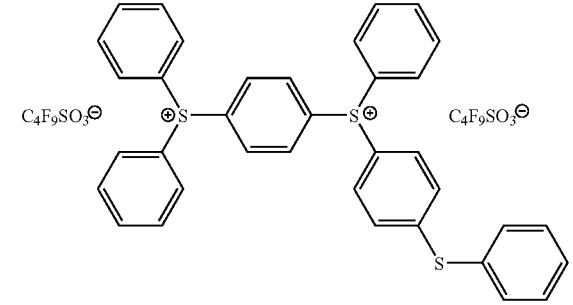

A-20
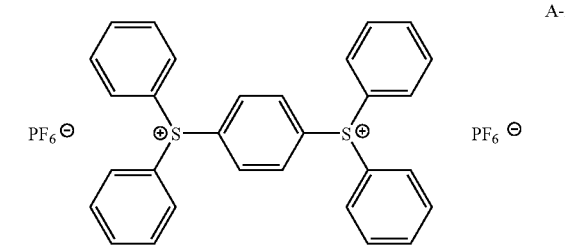

The acid generators (A) may be used individually or in combination of two or more thereof.

The content of the acid generator (A) in the resist composition is preferably from 3.6 to 15 wt %, more preferably from 3.6 to 13 wt %, still more preferably from 3.6 to 12 wt %, based on the solid content of the composition. With the acid generator (A) content of 3.6 wt % or more, reduction in the resolution of isolate pattern can be prevented. Also, with the content of 15 wt % or less, in a negative composition, the formation of a round-top shape in a line pattern can be prevented, and in a positive composition, the footing formation in a line pattern can be prevented.

[2] (E) Acid Generator Which can be Used in Combination Other than the Acid Generator (A)

In the present invention, a compound capable of generating an acid upon irradiation with actinic rays or radiation (hereinafter sometimes referred to as an "acid generator (E)"), other than the acid generator (A), may be used in combination.

The amount of the acid generator (E) which can be used in combination with the acid generator (A) is, in terms of the molar ratio (acid generator (A)/acid generator (E)), usually from 100/0 to 20/80, preferably from 100/0 to 40/60, still more preferably from 100/0 to 50/50.

The acid generator (E) which can be used in combination may be appropriately selected from photo-initiators for photo-cationic polymerization, photo-initiators for photo-radical polymerization, photo-decoloring agents for dyes, photo-discoloring agents, known compounds capable of generating an acid upon irradiation with actinic ray or radiation, which are used for microresist or the like, and mixtures thereof.

Examples thereof include diazonium salt, phosphonium salt, iodonium salt, imidosulfonate, oximesulfonate, diazodisulfone, disulfone and o-nitrobenzyl sulfonate.

Also, a compound where the above-described group or compound capable of generating an acid upon irradiation with actinic rays or radiation is introduced into the main chain or side chain of polymer may be used and examples thereof include the compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Furthermore, a compound capable of generating an acid by light described in U.S. Pat. No. 3,779,778 and European Patent 126,712 may also be used.

Among the acid generators (E) which can be used, particularly preferred examples are set forth below.

(z1)
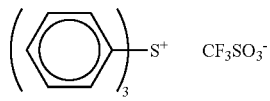

(z2)
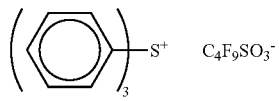

(z3)
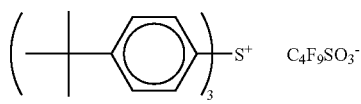

(z4)
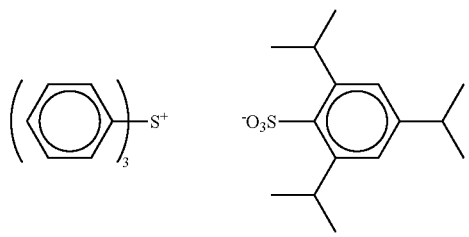

(z5)
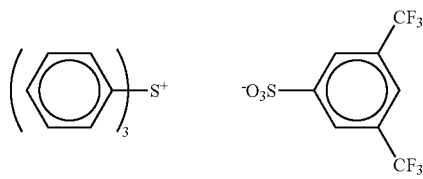

(z6)
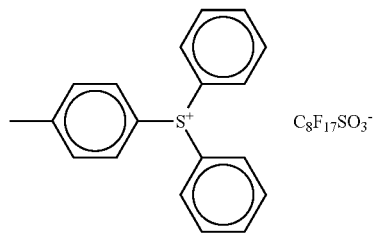

(z8)

(z9)
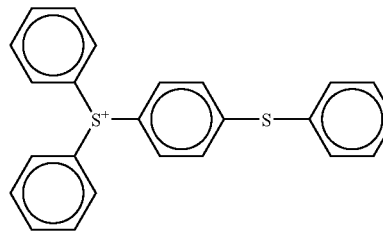

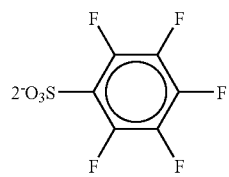

-continued
(z10)
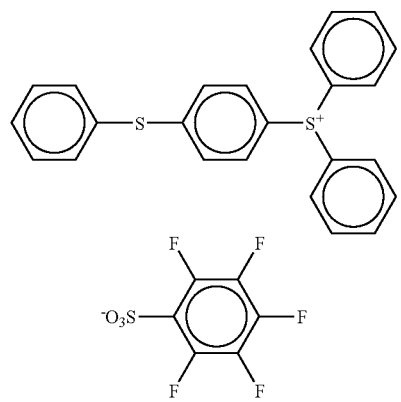
(z12)
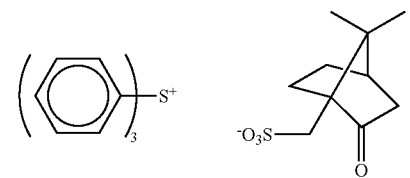
(z13)
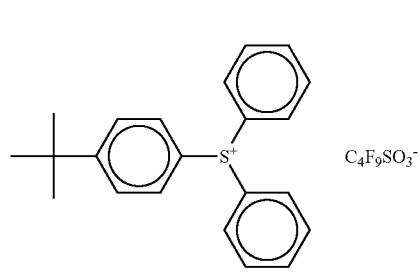
(z14)
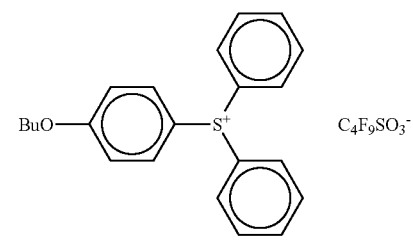
(z15)
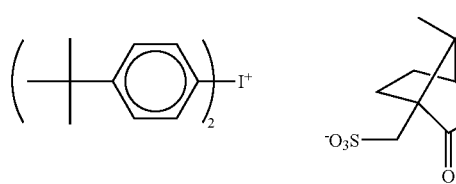
(z16)
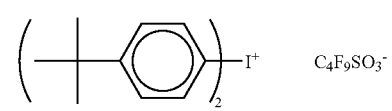
(z17)
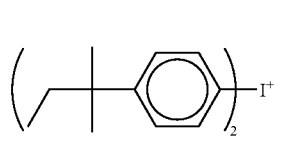
(z19)
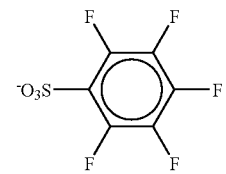
(z20)
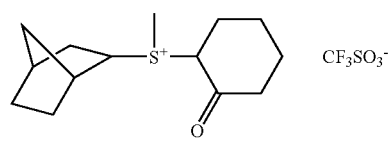
(z21)
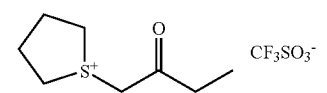

(z22) 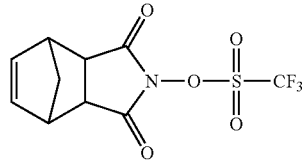
(z23) 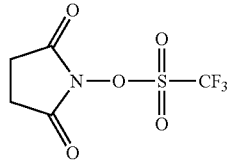
(z24) 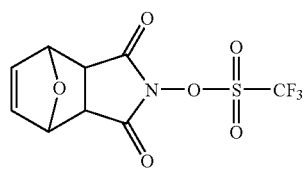
(z25) 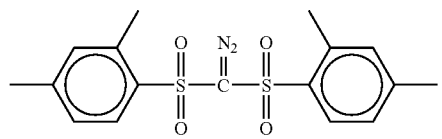
(z26) 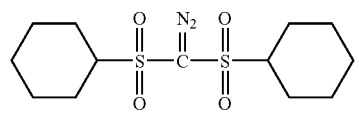
(z27) 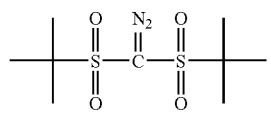
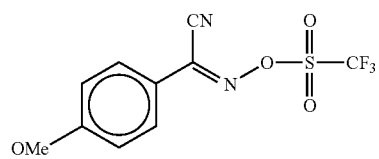
(z28)
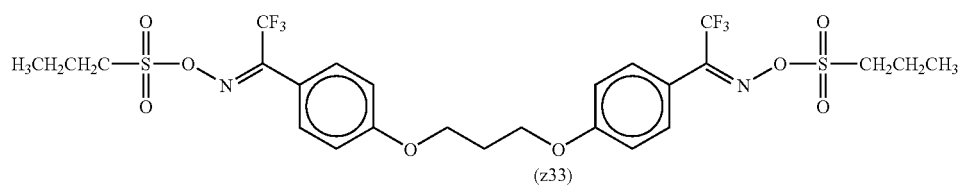
(z29)
(z33) 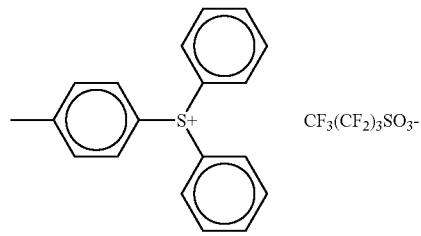
(z34) 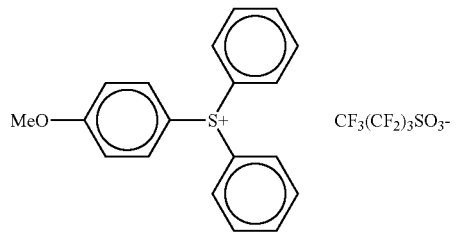

-continued

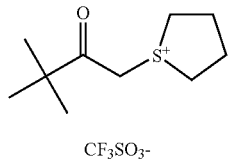

(z35)

CF₃SO₃⁻

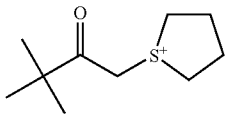

(z36)

CF₃(CF₂)₃SO₃⁻

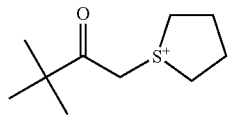

(z37)

CF₃(CF₂)₇SO₃⁻

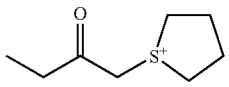

(z38)

CF₃(CF₂)₃SO₃⁻

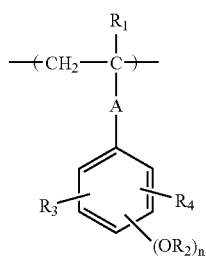

(z39)

CF₃(CF₂)₇SO₃⁻

[3] (B) Alkali-Soluble Resin

As the alkali-soluble resin for use in the present invention, polymers having a phenol skeleton disclosed for resist can be widely used, such as phenol novolak resin, polyvinylphenol resin, copolymer having a structural unit derived from vinylphenol, and resin obtained by partially protecting or modifying polyvinylphenol resin. Preferred examples thereof include a phenolic resin having a repeating unit represented by the following formula (b).

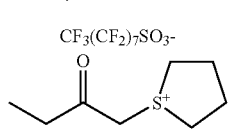

(b)

wherein $R_1$ represents a hydrogen atom, a halogen atom, a cyano group or an alkyl group which may have a substituent, $R_2$ represents an alkyl, cycloalkyl, aryl, aralkyl or acyl group which may have a substituent, $R_3$ and $R_4$ may be the same or different and each represents a hydrogen atom, a halogen atom, a cyano group or an alkyl, cycloalkyl, alkenyl, aralkyl or aryl group which may have a substituent, provided that when $R_3$ and $R_4$ are a hydrogen atom, this means that $R_3$ and $R_4$ each does not constitute a substituent on the benzene ring of formula (b), A represents a single bond, an alkylene, alkenylene, cycloalkylene or arylene group which may have a substituent, —O—, —SO₂—, —O—CO—$R_5$—, —CO—O—$R_6$— or —CO—N($R_7$)—$R_8$—, $R_5$, $R_6$ and $R_8$ each represents a single bond, an alkylene, alkenylene, cycloalkylene or arylene group which may have a substituent, or a divalent group formed after at least one of these groups combines with at least one structure selected from the group consisting of an ether structure, an ester structure, an amide structure, a urethane structure and a ureido structure, $R_7$ represents a hydrogen atom or an alkyl, cycloalkyl, aralkyl or aryl group which may have a substituent, n represents an integer of 1 to 3, and a plurality of $R_2$s or a pair of $R_2$ and $R_3$ or $R_4$ may combine to form a ring.

The alkyl group of $R_1$ to $R_4$ and $R_7$ is, for example, an alkyl group having a carbon number of 1 to 8 and specific preferred examples thereof include a methyl group, an ethyl group, a propyl group, an n-butyl group, a sec-butyl group, a hexyl group, a 2-ethylhexyl group and an octyl group.

The cycloalkyl group of $R_2$ to $R_4$ and $R_7$ may be monocyclic or polycyclic. Preferred examples of the monocyclic cycloalkyl group include a cycloalkyl group having a carbon number of 3 to 8, such as cyclopropyl, cyclopentyl and cyclohexyl group. Preferred examples of the polycyclic cycloalkyl group include an adamantyl group, a norbornyl group, an isoboronyl group, a dicyclopentyl group, an α-pinel group and a tricyclodecanyl group.

The alkenyl group of $R_3$ and $R_4$ is, for example, an alkenyl group having a carbon number of 2 to 8 and specific preferred examples thereof include a vinyl group, an allyl group, a butenyl group and a cyclohexenyl group.

The aryl group of $R_2$ to $R_4$ and $R_7$ is, for example, an aryl group having a carbon number of 6 to 15 and specific preferred examples thereof include a phenyl group, a tolyl group, a dimethylphenyl group, a 2,4,6-trimethylphenyl group, a naphthyl group and an anthryl group.

The aralkyl group of $R_2$ to $R_4$ and $R_7$ is, for example, an aralkyl group having a carbon number of 7 to 12 and specific preferred examples thereof include a benzyl group, a phenethyl group and a naphthylmethyl group.

The acyl group of $R_2$ is, for example, an acyl group having a carbon number of 1 to 8 and specific preferred examples thereof include a formyl group, an acetyl group, a propanoyl group, a butanoyl group, a pivaloyl group and benzoyl group.

Preferred examples of the alkylene group of A, $R_5$, $R_6$ and $R_8$ include an alkylene group having a carbon number of 1 to 8, which may have a substituent, such as methylene group, ethylene group, propylene group, butylene group, hexylene group and octylene group.

Preferred examples of the alkenylene group of A, $R_5$, $R_6$ and $R_8$ include an alkenylene group having a carbon number of 2 to 6, which may have a substituent, such as ethenylene group, propenylene group and butenylene group.

Preferred examples of the cycloalkylene group of A, $R_5$, $R_6$ and $R_8$ include a cycloalkylene group having a carbon number of 5 to 8, which may have a substituent, such as cyclopentylene group and cyclohexylene group.

Preferred examples of the arylene group of A, $R_5$, $R_6$ and $R_8$ include an arylene group having a carbon number of 6 to 12, such as phenylene group, tolylene group and naphthylene group.

These alkyl group, cycloalkyl group, aryl group, aralkyl group, acyl group, alkenyl group, alkylene group, alkenylene group, cycloalkylene group and arylene group each may have a substituent.

Examples of the substituent substituted to these groups include those having active hydrogen, such as amino group, amido group, ureido group, urethane group, hydroxyl group and carboxyl group, a halogen atom (e.g., fluorine, chlorine, bromine, iodine), an alkoxy group (e.g., methoxy, ethoxy, propoxy, butoxy), a thioether group, an acyl group (e.g., acetyl, propanoyl, benzoyl), an acyloxy group (e.g., acetoxy, propanoyloxy, benzoyloxy), an alkoxycarbonyl group (e.g., methoxycarbonyl, ethoxycarbonyl, propoxycarbonyl), a cyano group and a nitro group. In particular, those having active hydrogen, such as amino group, hydroxyl group and carboxyl group, are preferred.

Examples of the ring formed after a plurality of $R_2$s or a pair of $R_2$ and $R_3$ or $R_4$ combine include an oxygen-containing 4- to 7-membered ring such as benzofuran ring, benzodioxonol ring and benzopyran ring.

The alkali-soluble resin may be a resin comprising only the repeating unit represented by formula (b) but for the purpose of more improving the resist performance, another polymerizable monomer may be copolymerized.

Examples of the copolymerization monomer which can be used include compounds having one addition-polymerizable unsaturated bond selected from acrylic acid esters, acrylamides, methacrylic acid esters, methacrylamides, allyl compounds, vinyl ethers, vinyl esters, styrenes and crotonic acid esters.

Among these, preferred as the copolymerization component are monomers having a carboxyl group, such as N-(carboxyphenyl)acrylamide and N-(carboxyphenyl)methacrylamide, and monomers capable of improving the alkali solubility, such as maleimide.

In the present invention, the content of the another polymerizable monomer in the resin is preferably 50 mol % or less, more preferably 30 mol % or less, based on all repeating units.

Specific examples of the alkali-soluble resin having a repeating unit represented by formula (b) are set forth below, however, the present invention is not limited thereto.

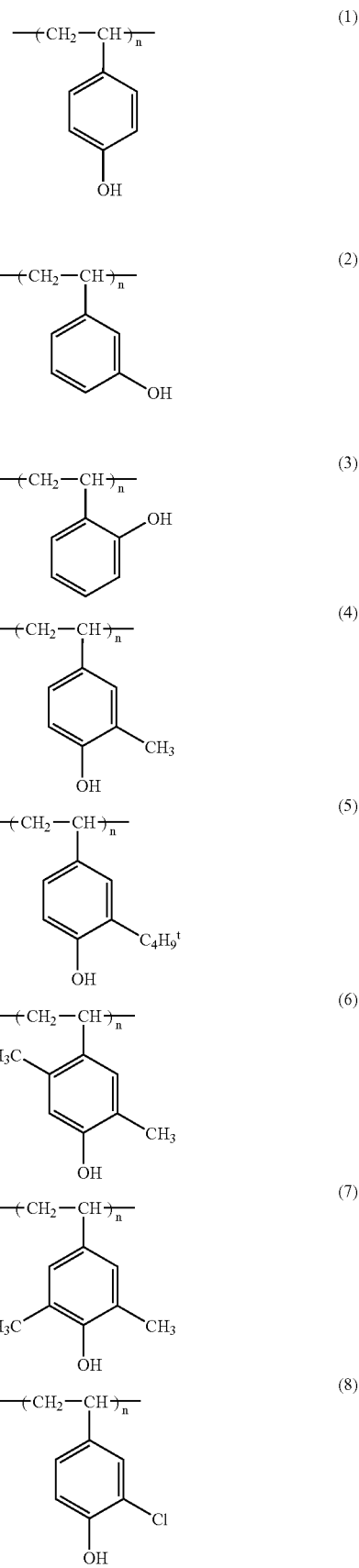

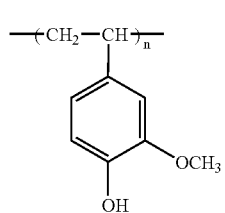 (9)
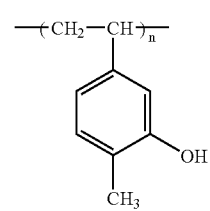 (10)
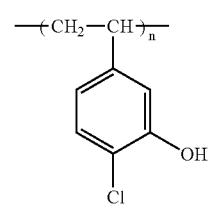 (11)
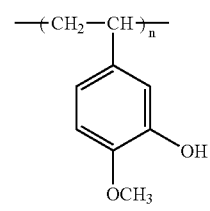 (12)
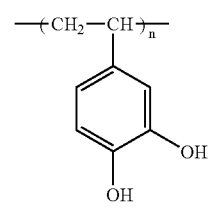 (13)
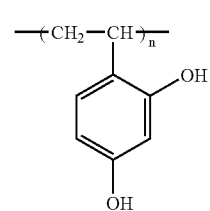 (14)
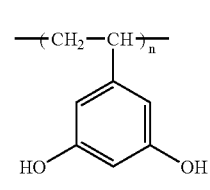 (15)
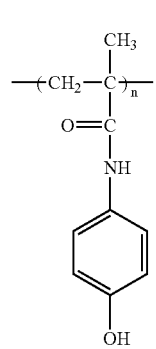 (16)
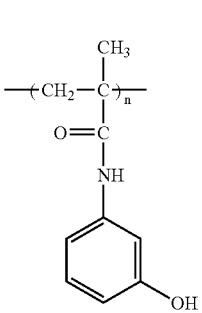 (17)
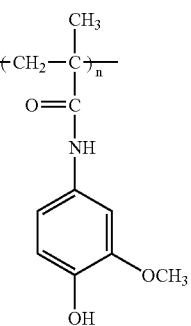 (18)
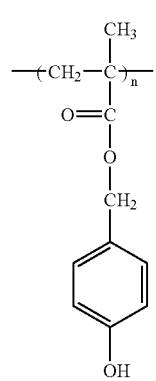 (19)

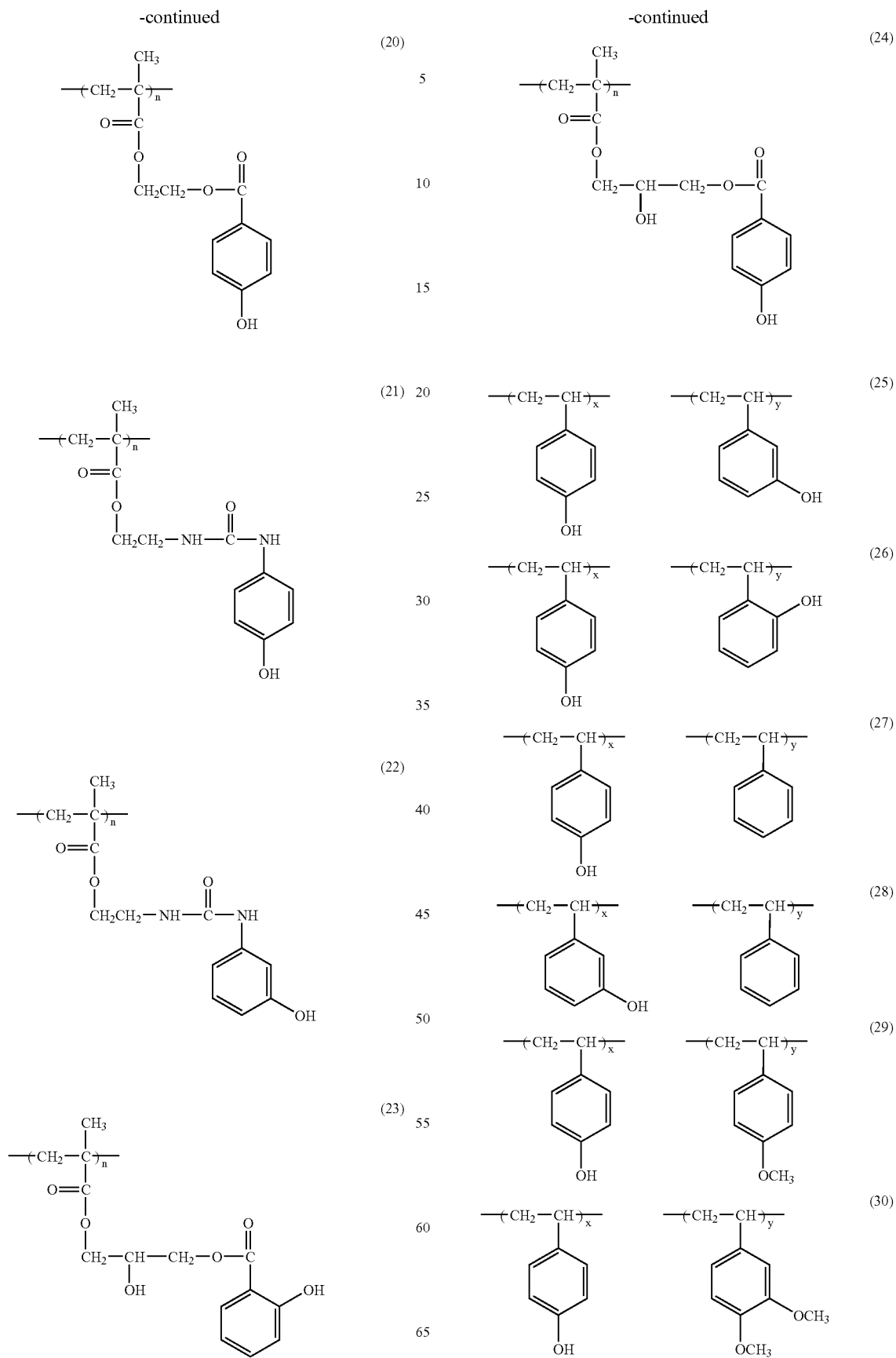

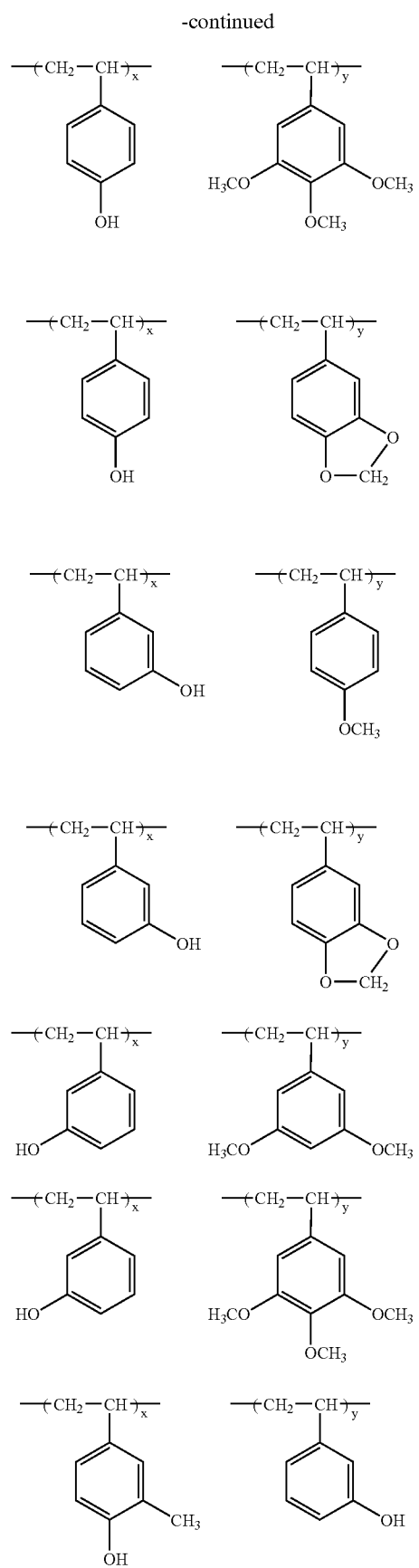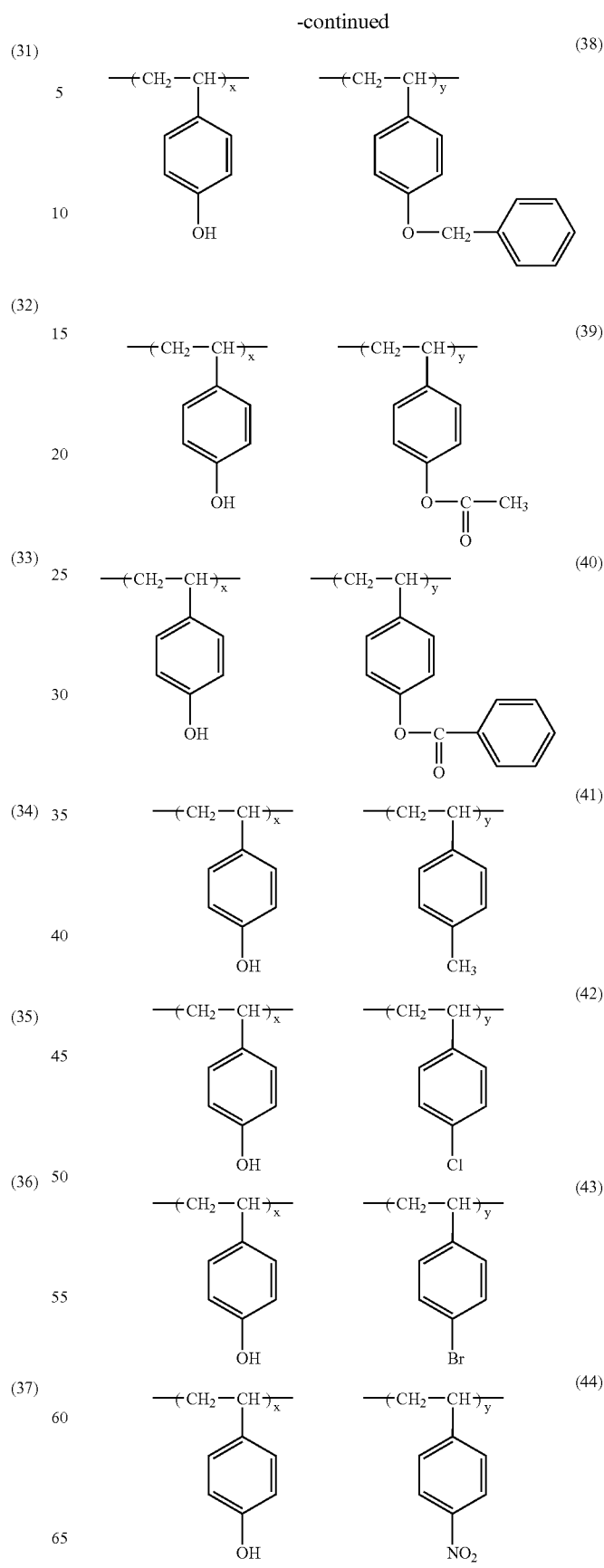

-continued
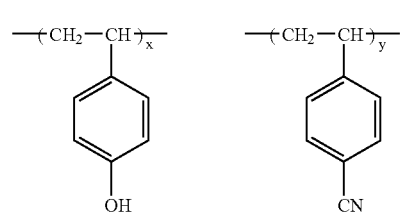 (45)
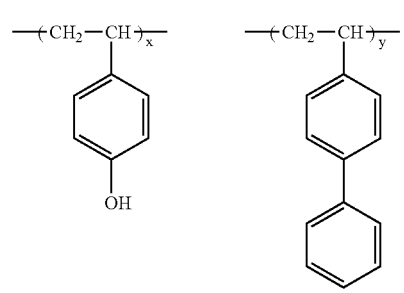 (46)
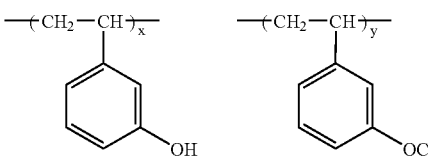 (47)
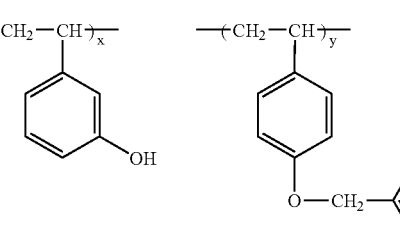 (48)
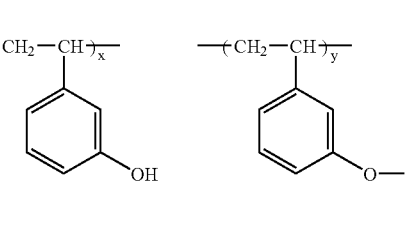 (49)
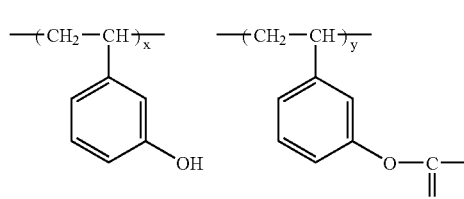 (50)
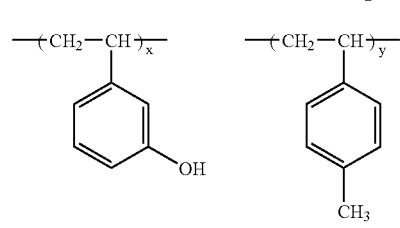 (51)
-continued
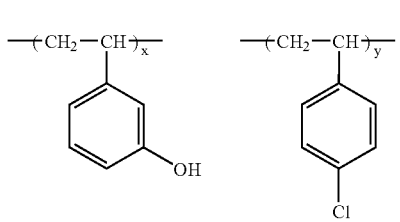 (52)
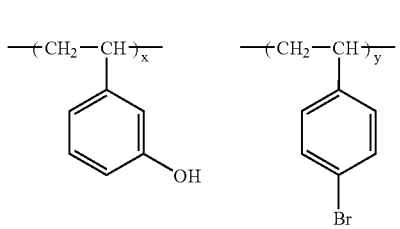 (53)
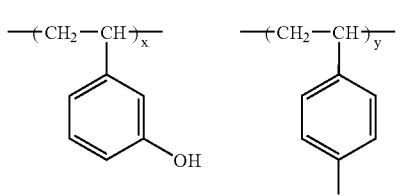 (54)
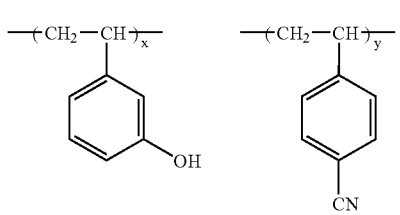 (55)
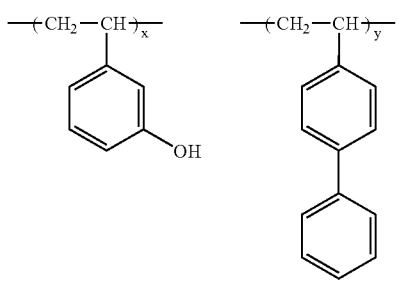 (56)
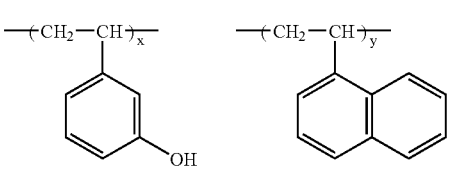 (57)
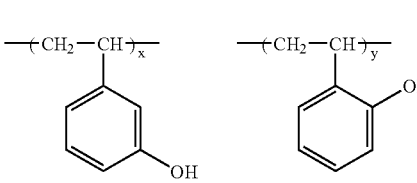 (58)

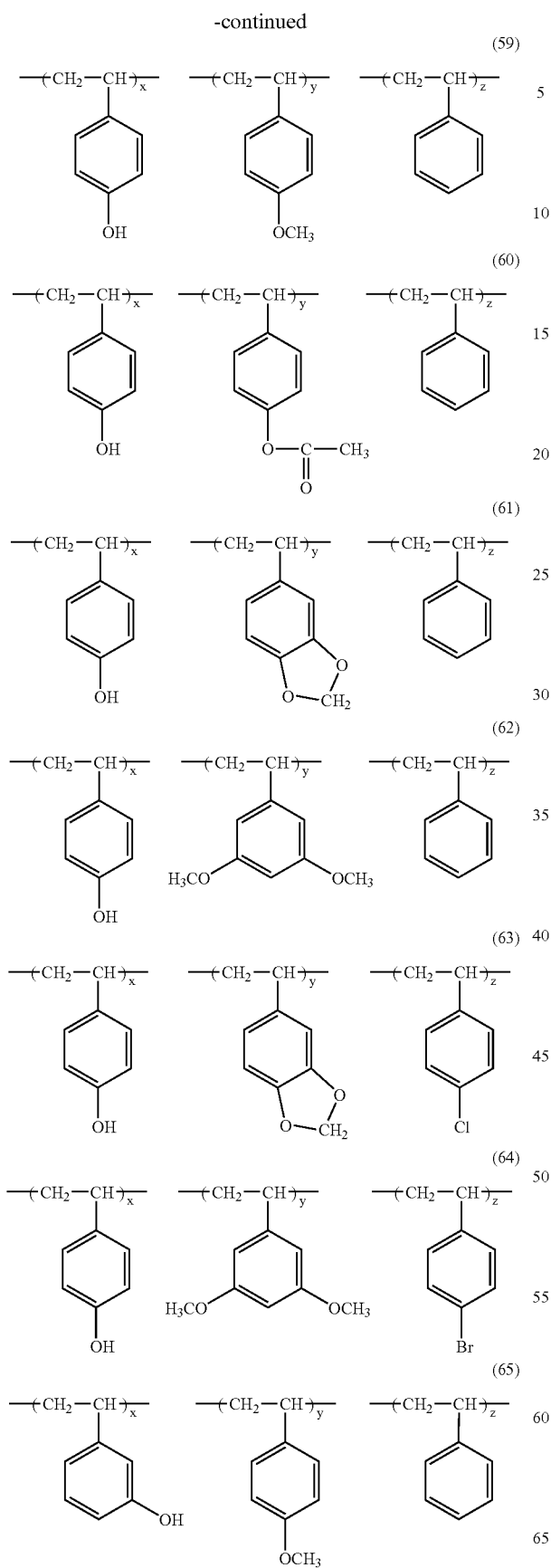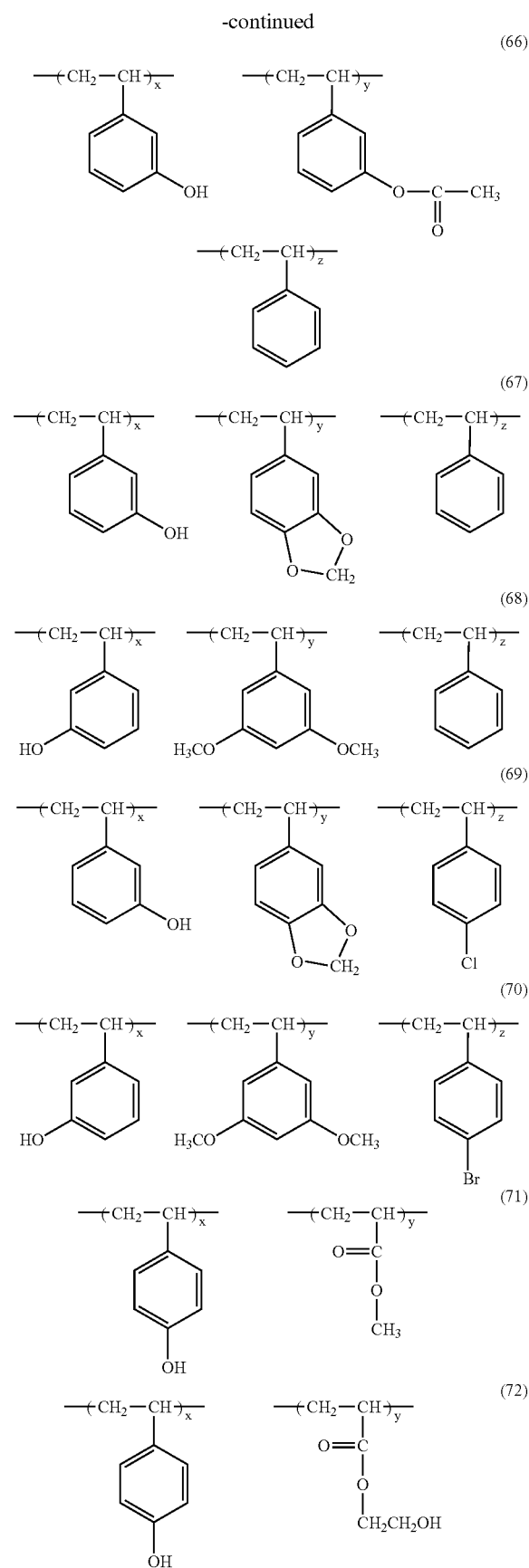

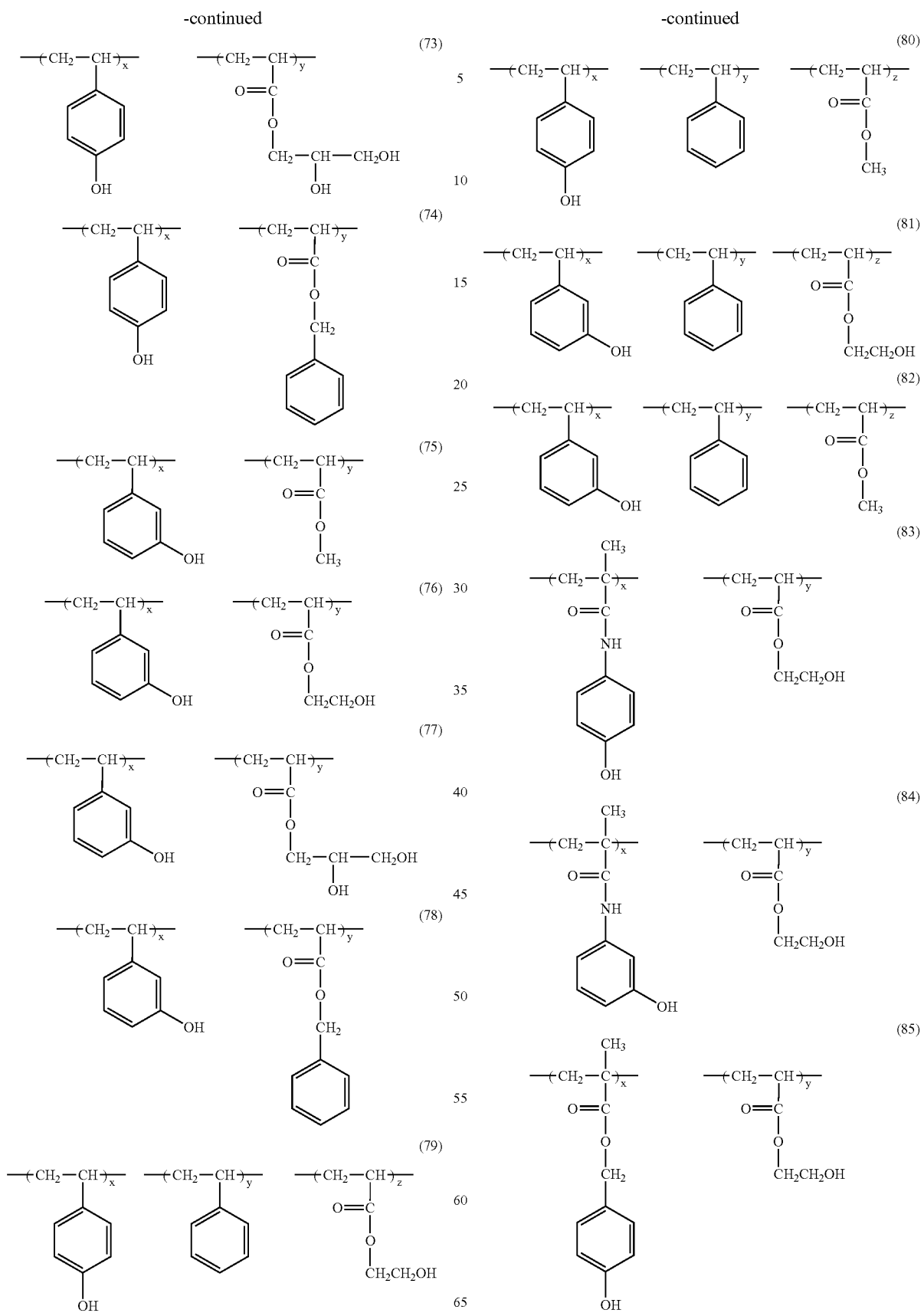

-continued

(86)
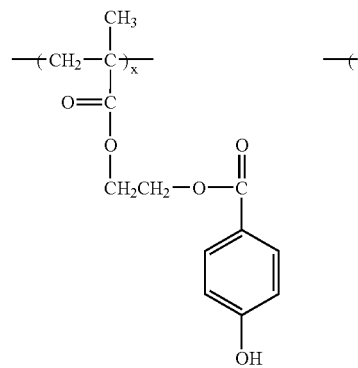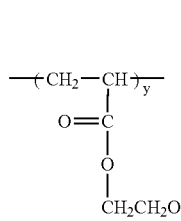

(87)
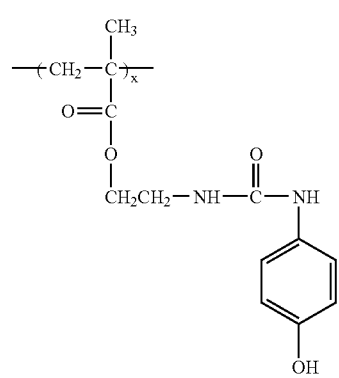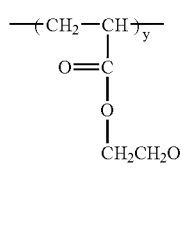

(88)
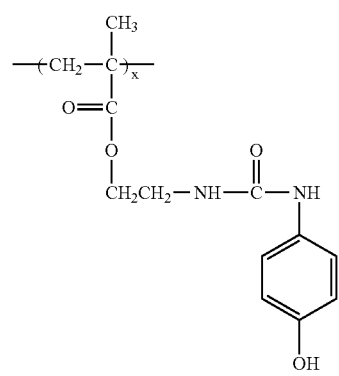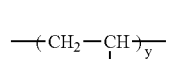

(89)
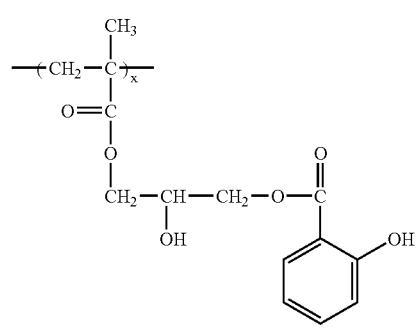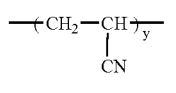

-continued

(90)
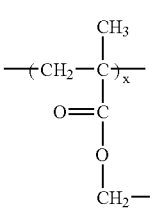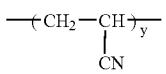

(91)
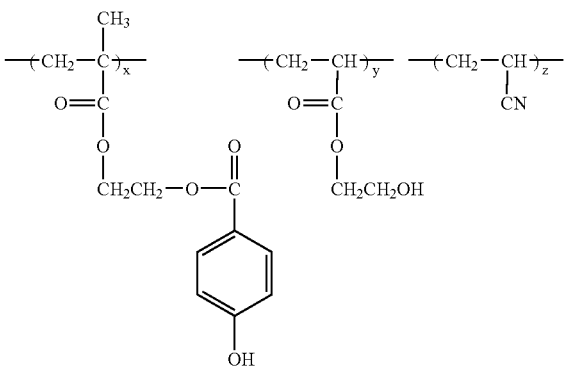

(92)
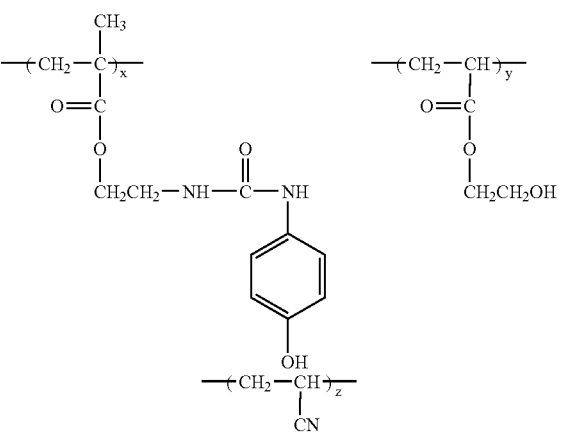

In these specific examples, n represents a positive integer, and x, y and z represent a molar ratio of the resin composition. In the case of a resin comprising two components, x=10 to 95 and y=5 to 90, preferably x=40 to 90 and y=10 to 60, and in the case of a resin comprising three components, x=10 to 90, y=5 to 85 and z=5 to 85, preferably x=40 to 80, y=10 to 50 and z=10 to 50.

The content of the repeating unit represented by formula (b) is from 5 to 100 mol %, preferably from 10 to 90 mol %, based on the entire resin.

A resin having either one of the repeating units represented by the following formulae (b-2) and (b-3) is also preferred as the alkali-soluble resin for use in the present invention:

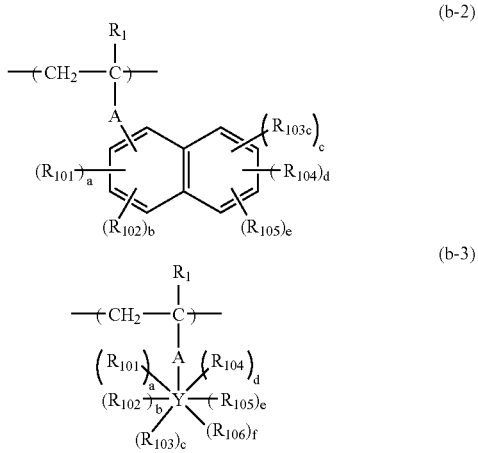

(b-2)

(b-3)

wherein $R_1$ and A have the same meanings as $R_1$ and A of formula (b), respectively, $R_{101}$ to $R_{106}$ each independently represents a hydroxy group, a carboxy group, an amino group or an alkyl, cycloalkyl, alkoxy, alkylcarbonyloxy, alkylsulfonyloxy, alkenyl, aryl, aralkyl, N-alkylamino or N-dialkylamino group which may have a substituent, a to f each independently represents an integer of 0 to 3, and Y represents a structure selected from the following condensed polycyclic aromatic structures:

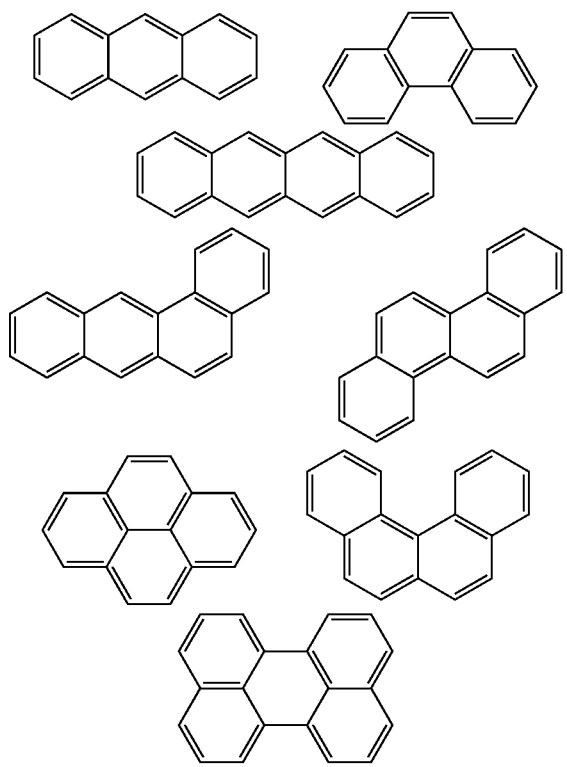

The alkyl group of $R_{101}$ to $R_{106}$ and the alkyl group in the alkoxy group, alkylcarbonyloxy group, alkylsulfonyloxy group, N-alkylamino group and N-dialkylamino group of $R_{101}$ to $R_{106}$ are preferably an alkyl group having a carbon number of 1 to 12 and may be either a linear alkyl group or a branched alkyl group. Examples thereof include a methyl group, an ethyl group, a propyl group, an n-butyl group, a sec-butyl group, a hexyl group, a 2-ethylhexyl group and an octyl group.

The cycloalkyl group of $R_{101}$ to $R_{106}$ is preferably a cycloalkyl group having a carbon number of 3 to 30 and may be a monocyclic cycloalkyl group or a polycyclic cycloalkyl group. Examples of the monocyclic cycloalkyl group include a cyclopropyl group, a cyclopentyl group and a cyclohexyl group. Examples of the polycyclic cycloalkyl group include an adamantyl group, a norbornyl group, an isoboronyl group, a dicyclopentyl group, an α-pinel group and a tricyclodecanyl group.

The alkenyl group of $R_{101}$ to $R_{106}$ is preferably an alkenyl group having a carbon number of 2 to 6 and examples thereof include a vinyl group, an allyl group, a butenyl group and a cyclohexenyl group.

The aryl group of $R_{101}$ to $R_{106}$ is preferably an aryl group having a carbon number of 6 to 10 and examples thereof include a phenyl group, a tolyl group, a dimethylphenyl group, a 2,4,6-trimethylphenyl group, a naphthyl group and an anthryl group.

The aralkyl group of $R_{101}$ to $R_{106}$ is preferably an aralkyl group having a carbon number of 7 to 12 and examples thereof include a benzyl group, a phenethyl group and a naphthylmethyl group.

$R_{101}$ to $R_{106}$ each may have a substituent.

Examples of the substituent which $R_{101}$ to $R_{106}$ may have include those having active hydrogen, such as amino group, amido group, ureido group, urethane group, hydroxyl group and carboxyl group, a halogen atom (e.g., fluorine, chlorine, bromine, iodine), an alkoxy group (e.g., methoxy, ethoxy, propoxy, butoxy), a thioether group, an acyl group (e.g., acetyl, propanoyl, benzoyl), an acyloxy group (e.g., acetoxy, propanoyloxy, benzoyloxy), an alkoxycarbonyl group (e.g., methoxycarbonyl, ethoxycarbonyl, propoxycarbonyl), a cyano group and a nitro group.

$R_{101}$ to $R_{106}$ each is preferably a hydroxy group, a linear or branched alkyl group having a carbon number of 1 to 6, an alkoxy group having a carbon number of 1 to 6, an alkylcarbonyloxy group having a carbon number of 1 to 6 or a phenyl group, more preferably a hydroxy group, a linear or branched alkyl group having a carbon number of 1 to 4 (e.g., methyl, ethyl, n-propyl, n-butyl, tert-butyl), an alkoxy group having a carbon number of 1 to 3 (e.g., methoxy, ethoxy) or a phenyl group a to f each is preferably an integer of 0 to 2.

In the condensed polycyclic aromatic structure represented by Y, the position of bond connected to the main chain or the position of bond connected to a substituent may be any position of bond on the condensed polycyclic aromatic structure.

The alkali-soluble resin for use in the present invention is preferably a copolymer containing a repeating unit having a monocyclic aromatic structure and a repeating unit having a polycyclic aromatic structure.

The content of the repeating unit represented by formula (b-2) and/or (b-3) is preferably from 3 to 50 mol %, more preferably from 5 to 40 mol %, based on all repeating units.

Examples of the alkali-soluble resin having a condensed polycyclic aromatic structure for use in the present invention are set forth below, however, the present invention is not limited thereto.

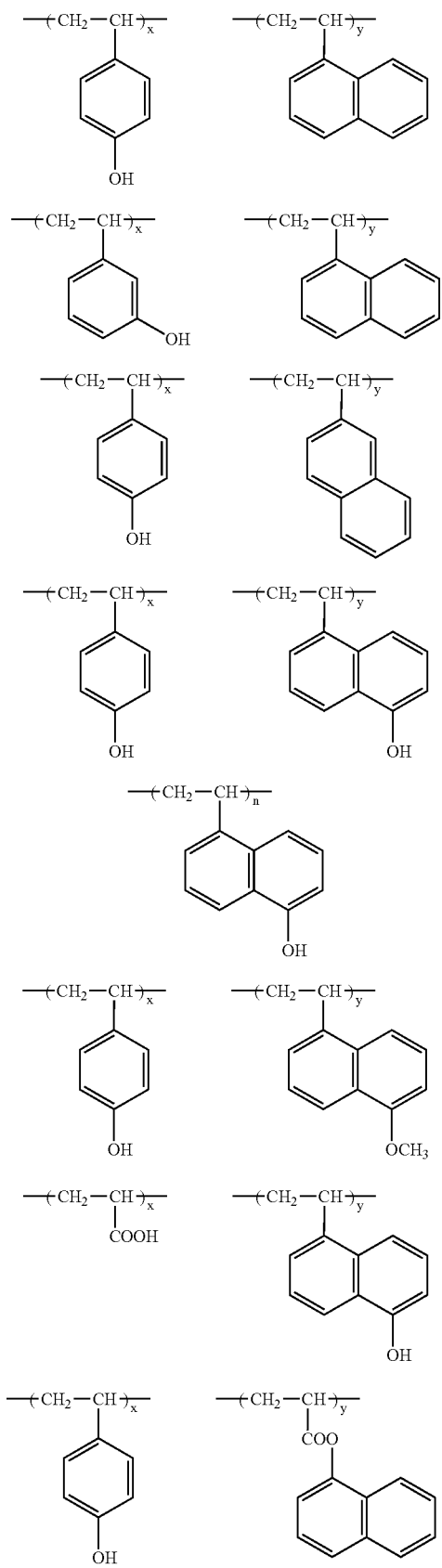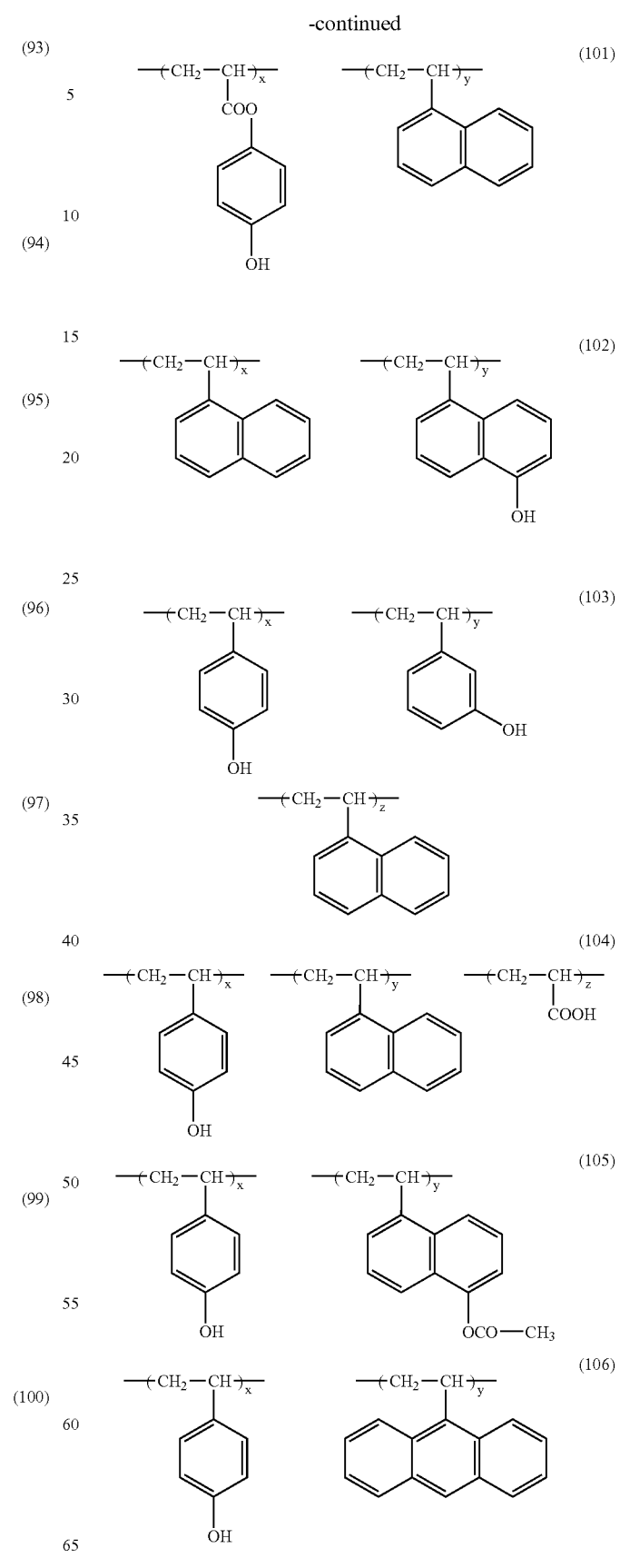

-continued

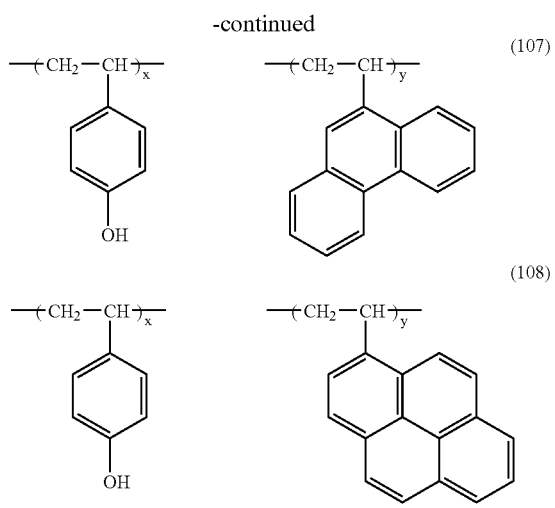

(107)

(108)

The molecular weight of the alkali-soluble resin is, in terms of a weight average molecular weight, preferably from 1,000 to 200,000, more preferably from 3,000 to 50,000. The weight average molecular weight as used herein is defined by the polystyrene conversion value according to gel permeation chromatography.

The molecular weight distribution of the alkali-soluble resin is from 1 to 10, preferably from 1 to 3, more preferably from 1 to 1.5. As the molecular weight distribution is narrower, the resolution, resist profile and side wall of resist pattern are more smoothed and the roughness property is more excellent.

The alkali-soluble resin can be synthesized by the methods described in *Macromolecules*, 28(11), 3787–3789 (1995), *Polym. Bull.* (*Berlin*), 24(4), 385–389 (1990) and JP-A-8-286375. That is, the objective alkali-soluble resin can be obtained by radical polymerization or living anion polymerization.

One of these alkali-soluble resins may be used or a plurality of alkali-soluble resins described above may be mixed and used.

The alkali dissolution rate of the alkali-soluble resin is preferably 20 Å/sec or more, more preferably 200 Å/sec or more, as measured (at 23° C.) in 0.261N tetramethylammonium hydroxide (TMAH).

The above-described alkali-soluble resin may be used alone but may be used in combination with another alkali-soluble resin. As for the use ratio, the another alkali-soluble resin can be used in combination in an amount of maximally 100 parts by weight per 100 parts of the above-described alkali-soluble resin. Examples of the alkali-soluble resin which can be used in combination are described below.

For example, a novolak resin, a hydrogenated novolak resin, an acetone-pyrogallol resin, a styrene-maleic anhydride copolymer, a carboxyl group-containing meth-acrylic resin and a derivative thereof may be used, however, the another alkali-soluble resin which can be used in combination is not limited thereto.

The amount of the alkali-soluble resin added is from 30 to 95 wt %, preferably from 40 to 90 wt %, more preferably from 50 to 80 wt %, based on the entire solid content of the composition.

[4] (D) Resin Capable of Increasing in the Solubility in an Alkali Developer Under the Action of an Acid The resin capable of increasing in the solubility in an alkali developer under the action of an acid, which is used for the positive resist composition of the present invention, is a resin where a group capable of decomposing by an acid (hereinafter sometimes referred to as an "acid decomposable group") is present in ether one or both of the main chain and the side chain of resin. This resin is hereinafter sometimes referred to as an "acid decomposable resin". Among these resins, a resin where a group capable of decomposing by an acid is present in the side chain is preferred.

The group capable of decomposing by an acid is preferably a group resultant from displacement of a hydrogen atom of a —COOH group or a —OR group with a group capable of splitting off by an acid. This group decomposes under the action of an acid and a —COOH group or a —OH group is formed, whereby the solubility of the acid decomposable resin in an alkali developer is increased.

Preferred examples of the acid decomposable group include a silyl ether group, a cumyl ester group, an acetal group, a tetrahydropyranyl ether group, an enol ether group, an enol ester group, a tertiary alkyl ether group, a tertiary alkyl ester group and a tertiary alkyl carbonate group. Among these, more preferred are a tertiary alkyl ester group, a tertiary alkyl carbonate group, a cumyl ester group, an acetal group and a tetrahydropyranyl ether group.

In the case where this group capable of decomposing by an acid is bonded as a side chain, the mother resin is an alkali-soluble resin having an —OH or —COOH group in the side chain. Examples thereof include the alkali-soluble resins described later.

The alkali dissolution rate of this alkali-soluble resin is preferably 170 Å/sec or more, more preferably 330 Å/sec or more (A is angstrom), as measured (at 23° C.) in 0.261N tetramethylammonium hydroxide (TMAH).

From this standpoint, the alkali-soluble resin is preferably an alkali-soluble resin having a hydroxystyrene structure unit, such as an o-, m- or p-poly(hydroxystyrene) or a copolymer thereof, a hydrogenated poly(hydroxystyrene), a halogen- or alkyl-substituted poly(hydroxystyrene), a partially O-alkylated or O-acylated poly(hydroxystyrene), a styrene-hydroxystyrene copolymer, an α-methylstyrene-hydroxystyrene copolymer and a hydrogenated novolak resin.

Examples of the repeating unit having an acid decomposable group preferred in the present invention include tert-butoxycarbonyloxystyrene, 1-alkoxyethoxy-styrene and (meth)acrylic acid tertiary alkyl ester.

The acid decomposable resin can be obtained by reacting an acid decomposable group precursor with an alkali-soluble resin or copolymerizing an acid decomposable group-bonded alkali-soluble resin monomer with various monomers, and this is disclosed in European Patent 254853, JP-A-2-25850, JP-A-3-223860 and JP-A-4-251259.

Specific examples of the acid decomposable resin are set forth below, however, the acid decomposable resin is not limited thereto.

p-tert-Butoxystyrene/p-hydroxystyrene copolymer
p-(tert-Butoxycarbonyloxy)styrene/p-hydroxystyrene copolymer
p-(tert-Butoxycarbonylmethyloxy)styrene/p-hydroxystyrene copolymer
4-(tert-Butoxycarbonylmethyloxy)-3-methylstyrene/4-hydroxy-3-methylstyrene copolymer
p-(tert-Butoxycarbonylmethyloxy)styrene/p-hydroxystyrene (10% hydrogenated product) copolymer
m-(tert-Butoxycarbonylmethyloxy)styrene/m-hydroxystyrene copolymer o-(tert-Butoxycarbonylmethyloxy)styrene/o-hydroxystyrene copolymer p-(Cumyloxycarbonylmethyloxy)styrene/p-hydroxystyrene copolymer Cumyl methacrylate/methyl methacrylate copolymer 4-tert-Butoxycarbonylstyrene/dimethyl maleate copolymer Benzyl methacrylate/tetrahydropyranyl methacrylate, p-(tert-Butoxycarbonylmethyloxy)styrene/p-hydroxystyrene/styrene copolymer p-tert-Butoxystyrene/p-hydroxystyrene/fumaronitrile copolymer tert-Butoxystyrene/hydroxyethyl methacrylate copolymer Styrene/N-(4-hydroxyphenyl)maleimide/N-(4-tert-butoxycarbonyloxyphenyl)maleimide copolymer p-Hydroxystyrene/tert-butyl methacrylate copolymer Styrene/p-hydroxystyrene/tert-butyl methacrylate copolymer p-Hydroxystyrene/tert-butyl acrylate copolymer Styrene/p-hydroxystyrene/tert-butyl acrylate copolymer p-(tert-Butoxycarbonylmethyloxy)styrene/p-hydroxystyrene/N-methylmaleimide copolymer tert-Butyl methacrylate/1-adamantylmethyl methacrylate copolymer p-Hydroxystyrene/tert-butyl acrylate/p-acetoxystyrene copolymer p-Hydroxystyrene/tert-butyl acrylate/p-(tert-butoxycarbonyloxy)styrene copolymer p-Hydroxystyrene/tert-butyl acrylate/p-(tert-butoxycarbonylmethyloxy)styrene copolymer

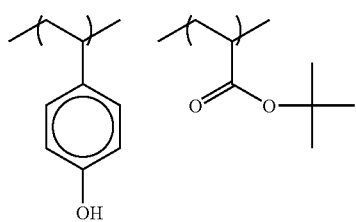
(R-21)

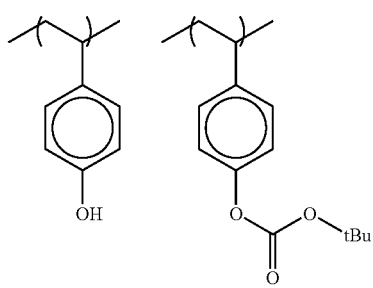
(R-22)

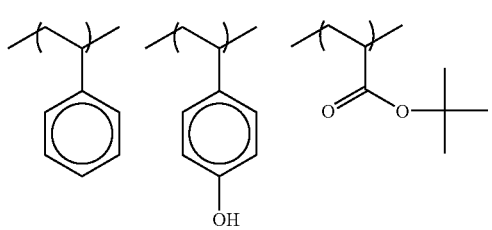
(R-23)

-continued

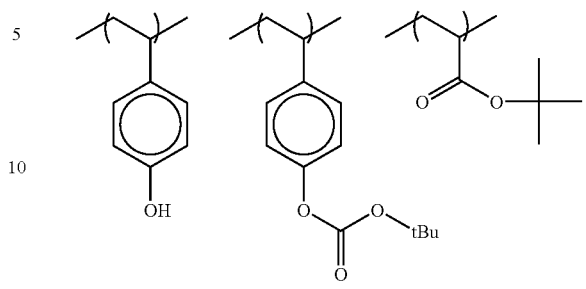
(R-24)

In these specific examples, "tBu" indicates a tert-butyl group.

The acid decomposable resin is preferably a resin (D1) having a repeating unit represented by formula (IV) and a repeating unit represented by formula (V). The resin (D1) having a repeating unit represented by formula (IV) and a repeating unit represented by formula (V) is preferred because the resolution and sensitivity are improved.

In formula (IV), L represents a hydrogen atom, a linear, branched or cyclic alkyl group which may be substituted, or an aralkyl group which may be substituted. Z represents a linear, branched or cyclic alkyl group which may be substituted, or an aralkyl group which may be substituted. Z and L may combine to form a 5- or 6-membered ring.

Examples of the alkyl group in L and Z of formula (IV) include a linear, branched or cyclic alkyl group having a carbon number of 1 to 20, such as methyl group, ethyl group, propyl group, n-butyl group, isobutyl group, tert-butyl group, pentyl group, cyclopentyl group, hexyl group, cyclohexyl group, octyl group and dodecyl group.

Preferred examples of the substituent which the alkyl group of L and Z can have include an alkyl group, an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue such as pyrrolidone residue. The substituent preferably has a carbon number of 12 or less.

Examples of the alkyl group having a substituent include a cyclohexylethyl group, an alkylcarbonyloxymethyl group, an alkylcarbonyloxyethyl group, an arylcarbonyloxy-ethyl group, an aralkylcarbonyloxyethyl group, an alkyloxy-methyl group, an aryloxymethyl group, an aralkyloxymethyl group, an alkyloxyethyl group, an aryloxyethyl group, an aralkyloxyethyl group, an alkylthiomethyl group, an arylthiomethyl group, an aralkylthiomethyl group, an alkylthioethyl group, an arylthioethyl group and an aralkylthioethyl group.

The alkyl in these groups is not particularly limited and may be linear, cyclic or branched or may have the above-described substituent such as alkyl group and alkoxy group.

Examples of the alkylcarbonyloxyethyl group include a cyclohexylcarbonyloxyethyl group, a tert-butylcyclohexylcarbonyloxyethyl group and an n-butylcyclohexylcarbonyloxyethyl group.

The aryl is also not particularly limited but an aryl having a carbon number of 6 to 14 is generally used, such as phenyl group, xylyl group, toluyl group, cumenyl group, naphthyl group and anthracenyl group, and the aryl may have the above-described substituent such as alkyl group and alkoxy group.

Examples of the aryloxyethyl group include a phenyloxyethyl group and a cyclohexylphenyloxyethyl group.

The aralkyl is also not particularly limited but examples thereof include a benzyl group.

Examples of the aralkylcarbonyloxyethyl group include a benzylcarbonyloxyethyl group.

Examples of the aralkyl group of L and Z in formula (IV) include an aralkyl group having a carbon number of 7 to 15, such as substituted or unsubstituted benzyl group and substituted or unsubstituted phenethyl group.

Preferred examples of the substituent of the aralkyl group include an alkoxy group, a hydroxyl group, a halogen atom, a nitro group, an acyl group, an acylamino group, a sulfonylamino group, an alkylthio group, an arylthio group and an aralkylthio group. Examples of the aralkyl group having a substituent include an alkoxybenzyl group, a hydroxybenzyl group and a phenylthiophenethyl group. The carbon number of the substituent which the aralkyl group of L or Z can have is preferably 12 or less.

When a highly bulky group such as phenyl group or cylohexyl group is introduced into the terminal of a substituted alkyl group or a substituted aralkyl group as described above, the edge roughness is more improved.

Examples of the 5- or 6-membered ring formed after L and Z combine with each other include a tetrahydropyran ring and a tetrahydrofuran ring.

The ratio of the repeating unit represented by formula (IV) and the repeating unit represented by formula (V) in the resin is preferably from 1/99 to 60/40, more preferably from 5/95 to 50/50, still more preferably from 10/90 to 40/60.

The acid decomposable resin (D1) having a repeating unit represented by formula (IV) and a repeating unit represented by formula (V) may further have a repeating unit derived from other monomers.

Examples of the other monomer include a hydrogenated hydroxystyrene; a halogen-, alkoxy- or alkyl-substituted hydroxystyrene; styrene; a halogen-, alkoxy-, acyloxy- or alkyl-substituted styrene; maleic anhydride; an acrylic acid derivative; a methacrylic acid derivative; and an N-substituted maleimide, however, the present invention is not limited thereto.

The ratio of the repeating units represented by formulae (IV) and (V) to the repeating unit of other monomer is, in terms of the molar ratio, [(IV)+(V)]/[other monomer]=from 100/0 to 50/50, preferably from 100/0 to 60/40, more preferably from 100/0 to 70/30.

Specific examples of the acid decomposable resin (D1) having a repeating unit represented by formula (IV) and a repeating unit represented by formula (V) are set forth below, however, the present invention is not limited thereto.

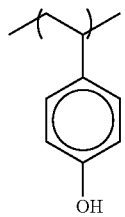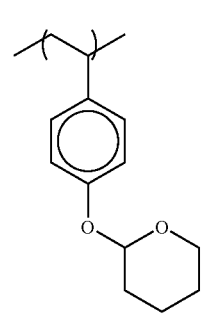

(R-1)

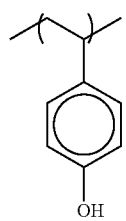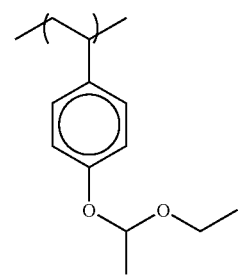

(R-2)

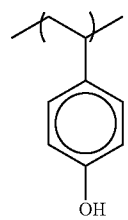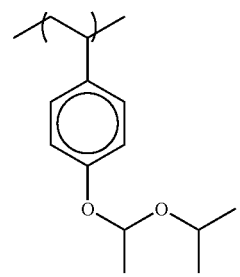

(R-3)

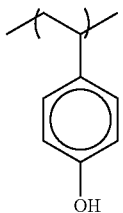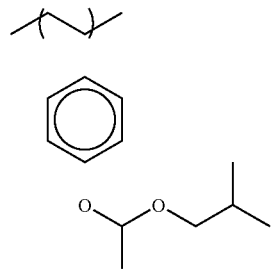

(R-4)

-continued
(R-5)
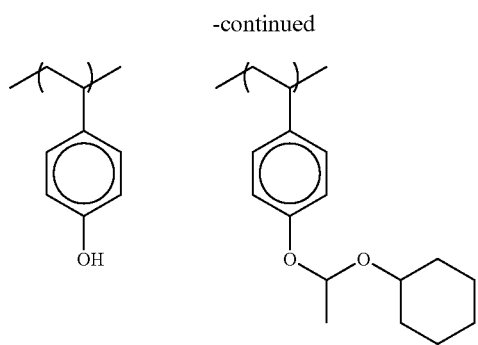
(R-6)
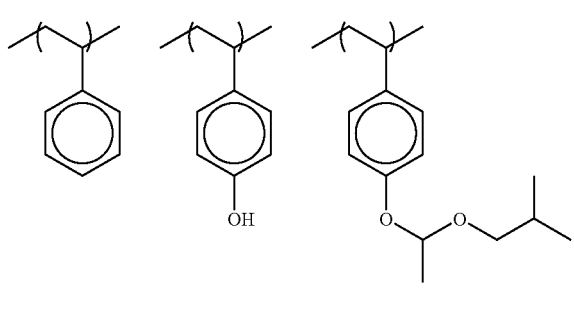
(R-7)
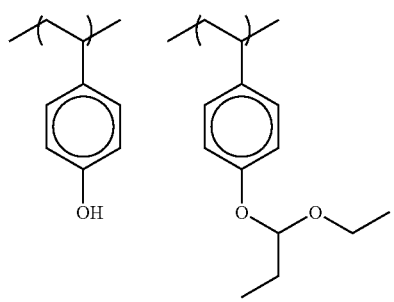
(R-8)
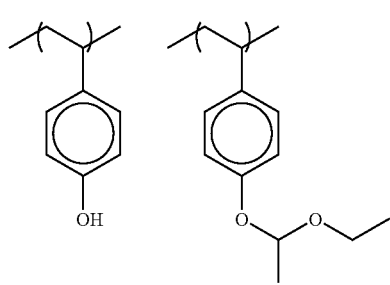
(R-9)
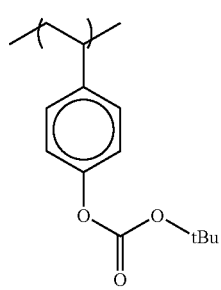
(R-10)
(R-11)

(R-12)
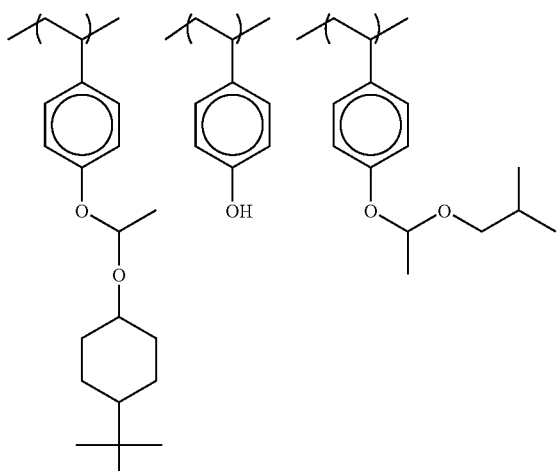
(R-13)
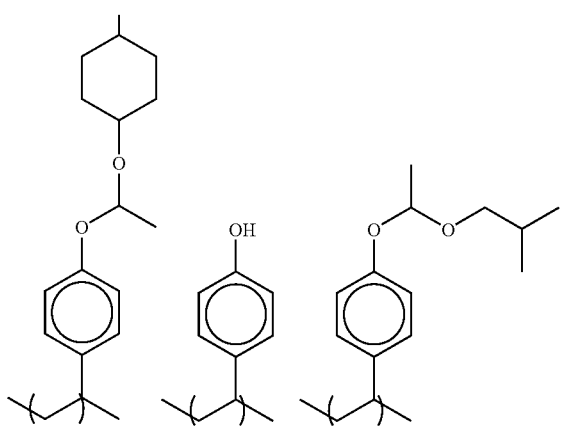
(R-14)
(R-15)
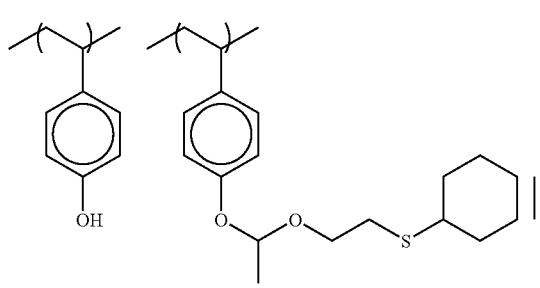
(R-16)
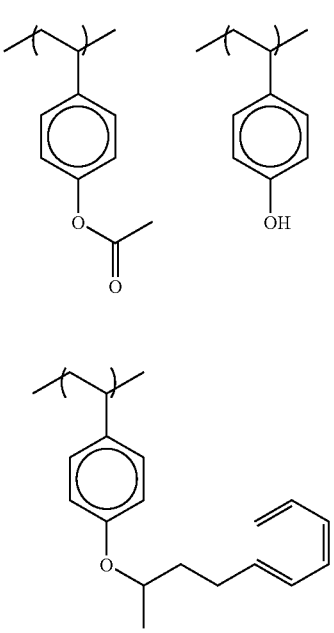
(R-17)
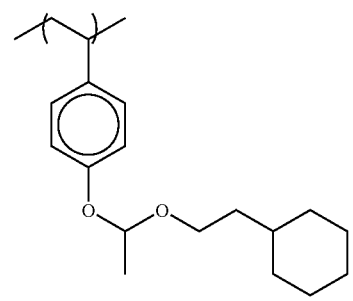

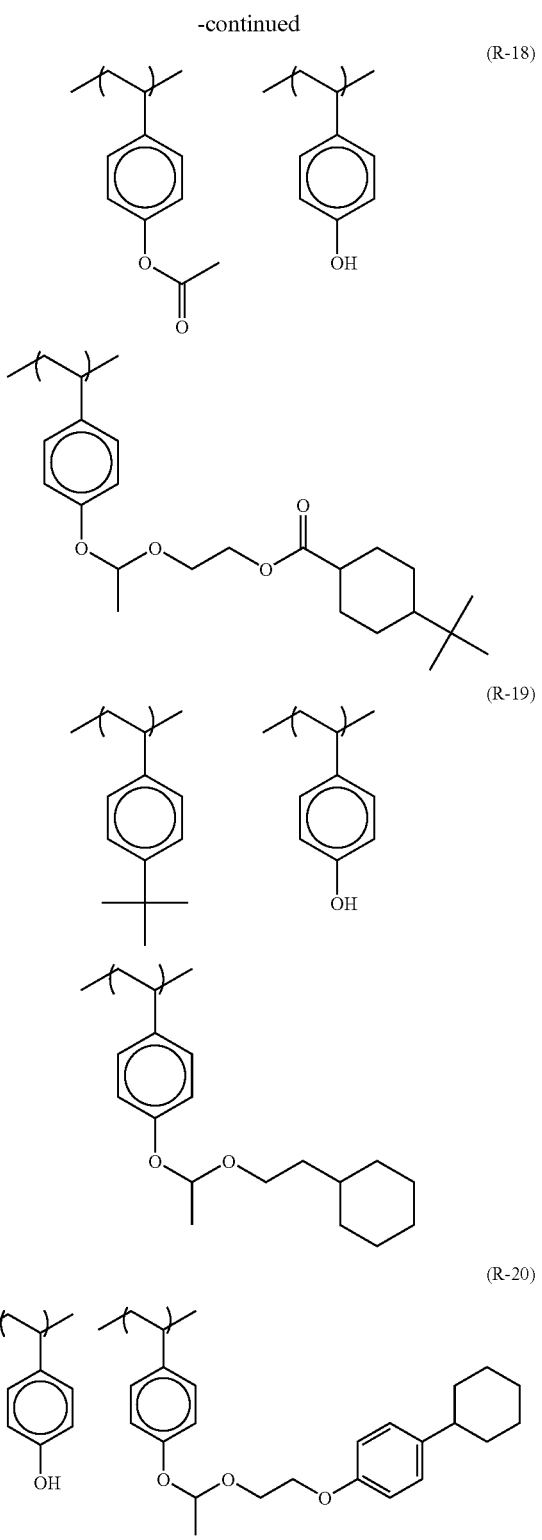

In these specific examples, "tBu" indicates a tert-butyl group.

The content of the group capable of decomposing by an acid is expressed by B/(B+S) using the number (B) of acid decomposable groups in the resin and the number (S) of alkali-soluble groups not protected by a group which splits off by an acid. The content is preferably from 0.01 to 0.7, more preferably from 0.05 to 0.50, still more preferably from 0.05 to 0.40.

In the case of irradiating ArF excimer laser light on the positive resist composition of the present invention, the acid decomposable resin is preferably a resin having a monocyclic or polycyclic alicyclic hydrocarbon structure and capable of increasing in the solubility in an alkali developer under the action of an acid.

In the case of irradiating $F_2$ excimer laser light on the positive resist composition of the present invention, the acid decomposable resin is preferably a resin having a structure where a fluorine atom is substituted to the main chain and/or side chain of the polymer skeleton, and capable of increasing in the solubility in an alkali developer under the action of an acid. The acid decomposable resin is more preferably a fluorine group-containing resin where at least one site selected from a perfluoroalkylene group and a perfluoroarylene group is present in the main chain of the polymer skeleton or where at least one site selected from a perfluoroalkyl group, a perfluoroaryl group, a hexafluoro-2-propanol group and a group resulting from protection of an OH group in a hexafluoro-2-propanol group is present in the side chain of the polymer skeleton.

The weight average molecular weight of the acid decomposable resin is preferably from 1,000 to 200,000 as a polystyrene conversion value by GPC. The weight average molecular weight of not less than 1,000 is preferable in view of the resistance against heat or dry etching, whereas the weight average molecular weight of not more than 200,000 is preferable in view of the developability and the viscosity, which causes good film formability.

In the positive resist composition of the present invention, the amount of the acid decomposable resin blended in the composition is preferably from 40 to 99.99 wt %, more preferably from 50 to 99.97 wt %, based on the entire resist solid content.

[5] (C) Crosslinking Agent of Undergoing an Addition Reaction with the Alkali-Soluble Resin Under the Action of an Acid In the negative resist composition of the present invention, a crosslinking agent of undergoing an addition reaction with an alkali-soluble resin under the action of an acid (hereinafter, sometimes referred to as a "cross-linking agent") is used. In this composition, a known crosslinking agent can be effectively used.

The crosslinking agent is preferably a compound or resin having two or more hydroxymethyl groups, alkoxymethyl groups, acyloxymethyl groups or alkoxymethyl ether groups, or an epoxy compound.

The crosslinking agent is more preferably an alkoxymethylated or acyloxymethylated melamine compound or resin, an alkoxymethylated or acyloxymethylated urea compound or resin, a hydroxymethylated or alkoxymethylated phenol compound or resin, or an alkoxymethyl etherified phenol compound or resin.

Specifically, a phenol derivative can be used as the crosslinking agent. The phenol derivative is preferably a phenol derivative having a molecular weight of 1,200 or less, containing from 3 to 5 benzene rings within the molecule and having two or more hydroxymethyl groups or al koxymethyl groups in total, where the hydroxymethyl groups or alkoxymethyl groups are bonded collectively to at least any one of the benzene rings, or divisionally to the benzene rings. By using such a phenol derivative, the effect of the present invention can be more remarkably exerted.

The alkoxymethyl group bonded to the benzene ring is preferably an alkoxymethyl group having a carbon number of 6 or less, such as methoxymethyl group, ethoxymethyl group, n-propoxymethyl group, i-propoxymethyl group, n-butoxy-methyl group, i-butoxymethyl group, sec-butoxymethyl group and tert-butoxymethyl group. In addition, an alkoxy-substituted alkoxy group such as 2-methoxyethoxy group and 2-methoxy-1-propyl group is also preferred.

Among these phenol derivatives, particularly preferred are those shown below.

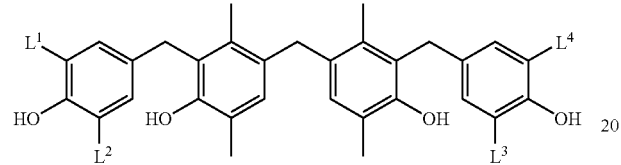

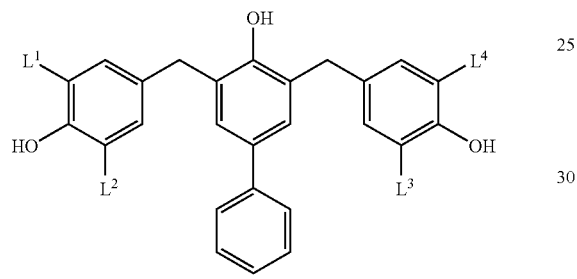

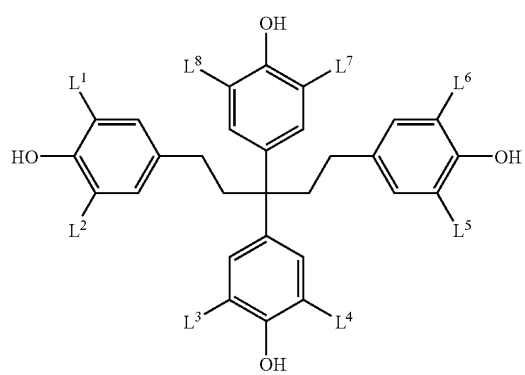

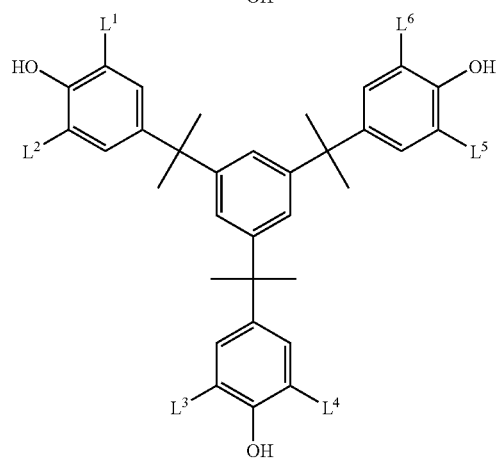

-continued

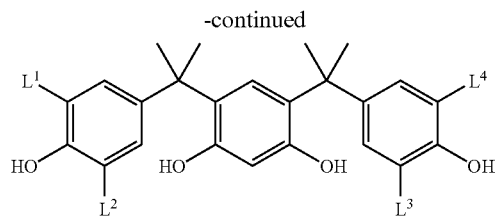

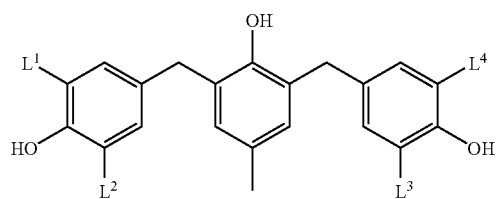

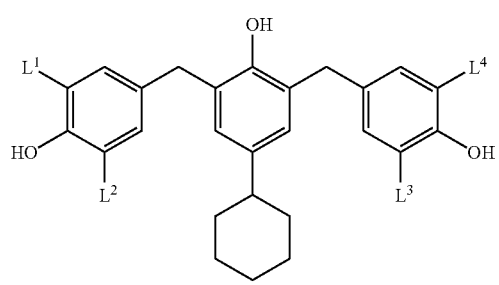

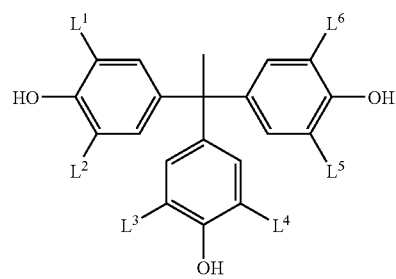

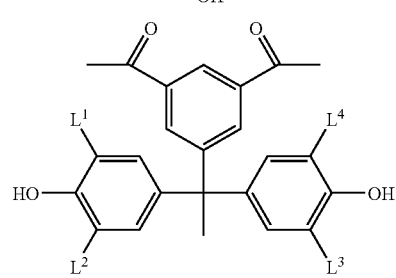

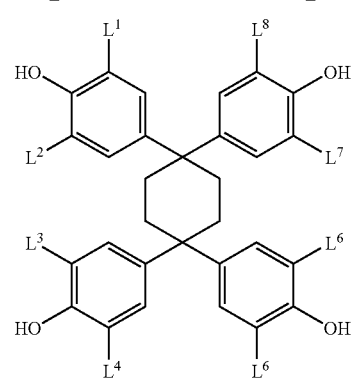

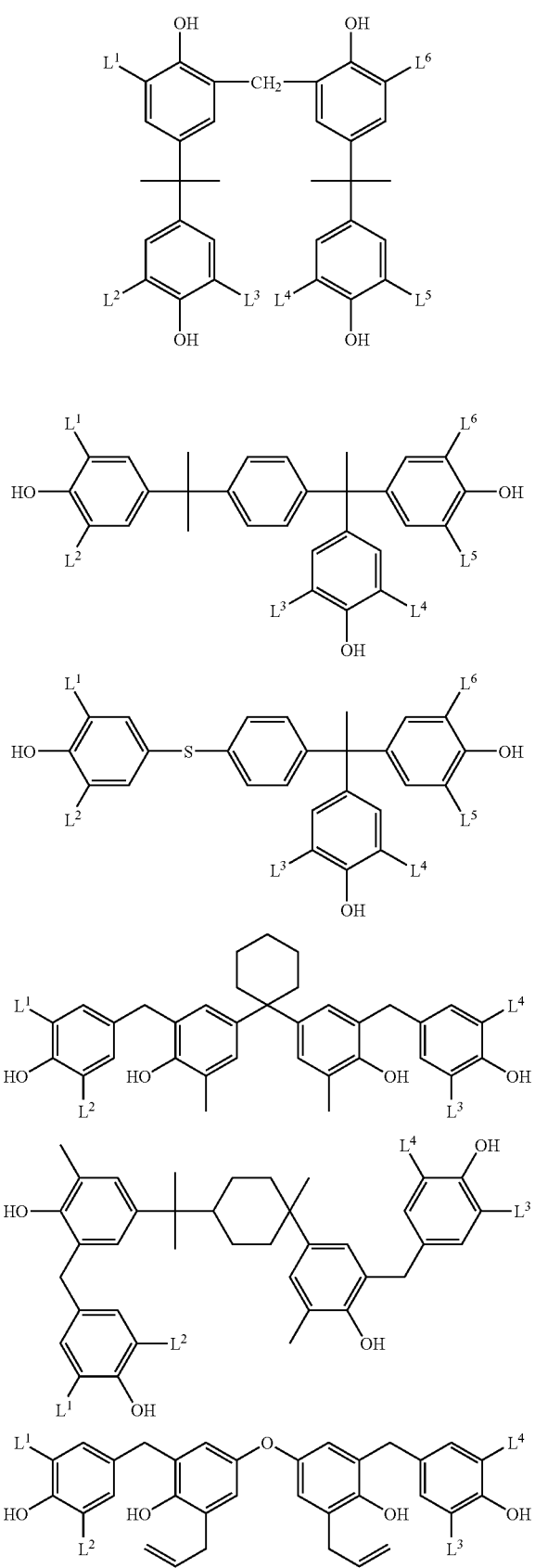
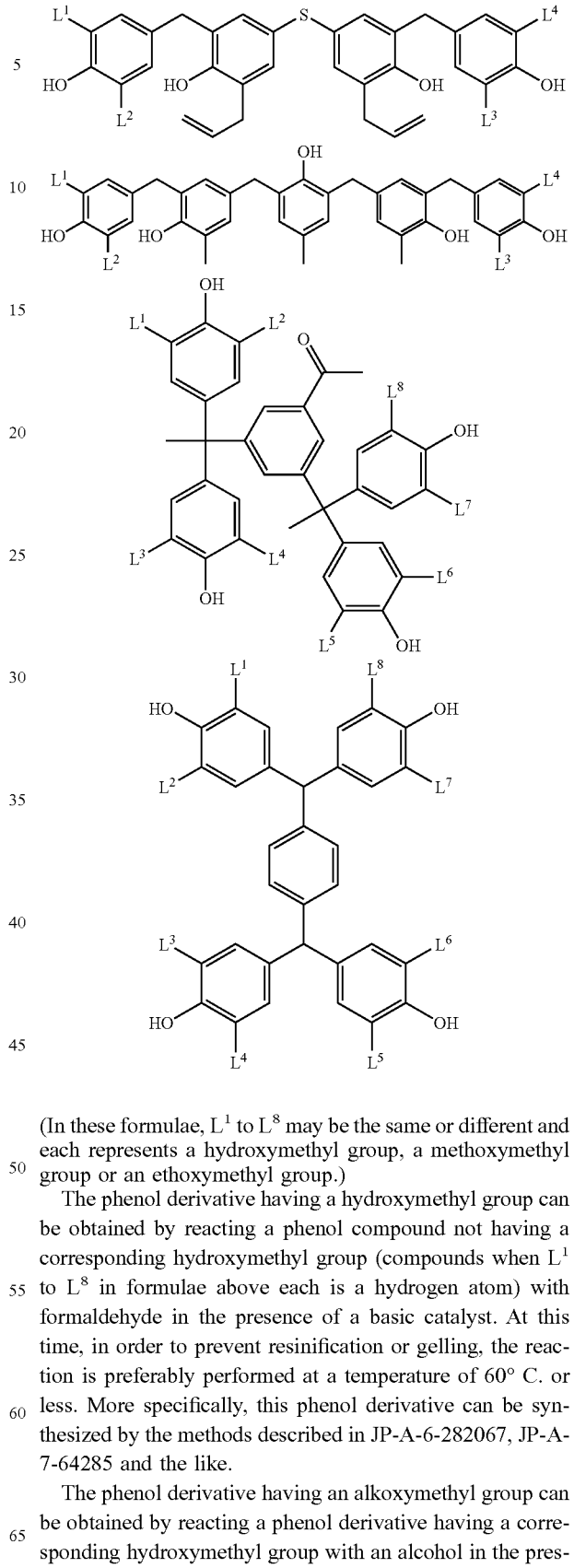

(In these formulae, $L^1$ to $L^8$ may be the same or different and each represents a hydroxymethyl group, a methoxymethyl group or an ethoxymethyl group.)

The phenol derivative having a hydroxymethyl group can be obtained by reacting a phenol compound not having a corresponding hydroxymethyl group (compounds when $L^1$ to $L^8$ in formulae above each is a hydrogen atom) with formaldehyde in the presence of a basic catalyst. At this time, in order to prevent resinification or gelling, the reaction is preferably performed at a temperature of 60° C. or less. More specifically, this phenol derivative can be synthesized by the methods described in JP-A-6-282067, JP-A-7-64285 and the like.

The phenol derivative having an alkoxymethyl group can be obtained by reacting a phenol derivative having a corresponding hydroxymethyl group with an alcohol in the presence of an acid catalyst. At this time, in order to prevent resinification or gelling, the reaction is preferably performed at a temperature of 100° C. or less. More specifically, this phenol derivative can be synthesized by the methods described in EP-A-632003 and the like.

The thus-synthesized phenol derivative having a hydroxymethyl group or an alkoxymethyl group is preferred in view of stability during storage but the phenol derivative having an alkoxymethyl group is more preferred in view of stability during storage.

These phenol derivatives where two or more hydroxymethyl groups or alkoxymethyl groups in total are contained and bonded collectively to at least any one of the benzene rings or divisionally to the benzene rings, may be used individually or in combination of two or more thereof.

Other than such phenol derivatives, the following compounds of (i) and (ii) can be used as the crosslinking group:
(i) Compound having N-hydroxymethyl group, N-alkoxymethyl group or N-acyloxymethyl group, and
(ii) Epoxy compound.

The crosslinking agent is added in an amount of 3 to 65 wt %, preferably from 5 to 50%, based on the entire solid content of the resist composition. If the amount of the crosslinking agent added is less than 3 wt %, the residual film ratio decreases, whereas if it exceeds 65 wt %, the resolution decreases and such an excessively large amount is also not preferred in view of stability during storage of the resist solution.

In the present invention, in addition to the phenol derivative, for example, the other crosslinking agent (i) or (ii) can also be used in combination.

The ratio of the phenol derivative to the other crosslinking agent which can be additionally used in combination is, in terms of the molar ratio, from 100/0 to 20/80, preferably from 90/10 to 40/60, more preferably from 80/20 to 50/50.

These crosslinking agents are described in detail below.

(i) Examples of the compound having an N-hydroxymethyl group, an N-alkoxymethyl group or an N-acyloxymethyl group include monomer- or oligomer-melamine-formaldehyde condensation products and urea-formaldehyde condensation products disclosed in EP-A-0133216 and West German Patents 3,634,671 and 3,711,264; alkoxy-substituted compounds disclosed in EP-A-0212482; and benzoguanamine-formaldehyde condensation products.

Among these, preferred are melamine-formaldehyde derivatives having at least two free N-hydroxymethyl groups, N-alkoxymethyl groups or N-acyloxymethyl groups, and more preferred are N-alkoxymethyl derivatives.

(ii) The epoxy compound includes a monomer-, dimer-, oligomer- or polymer-form compound having one or more epoxy group. Examples thereof include a reaction product of bisphenol A and epichlorohydrin and a reaction product of low molecular weight phenol-formaldehyde resin and epichlorohydrin. Other examples include epoxy resins described and used in U.S. Pat. No. 4,026,705 and British Patent 1,539,192.

[6] Dissolution Inhibiting Compound Capable of Increasing in the Solubility in an Alkali Developer Under the Action of an Acid The dissolution inhibiting compound capable of increasing in the solubility in an alkali developer under the action of an acid (hereinafter sometimes referred to as a "dissolution inhibiting compound") is preferably a compound having a molecular weight of 3,000 or less. In order to prevent reduction in the transmittance at 220 nm or less, an alicyclic or aliphatic compound having an acid decomposable group, such as cholic acid derivative described in *Proceeding of SPIE*, 2724, 355 (1996), is preferred. Examples of the acid decomposable group include those described above for the acid decomposable resin.

In the case where the resist composition of the present invention is exposed with a KrF excimer laser or irradiated with electron beams, the dissolution inhibiting compound preferably contains a structure such that a phenolic hydroxyl group of a phenol compound is displaced with an acid decomposable group. The phenol compound preferably contains from 1 to 9 phenol skeletons, more preferably from 2 to 6 phenol skeletons.

The molecular weight of the dissolution inhibiting compound for use in the present invention is 3,000 or less, preferably from 300 to 3,000, more preferably from 500 to 2,500.

The amount of the dissolution inhibiting compound added is preferably from 3 to 50 wt %, more preferably from 5 to 40 wt %, based on the entire solid content of the resist composition.

Specific examples of the dissolution inhibiting compound are set forth below, however, the dissolution inhibiting compound is not limited thereto.

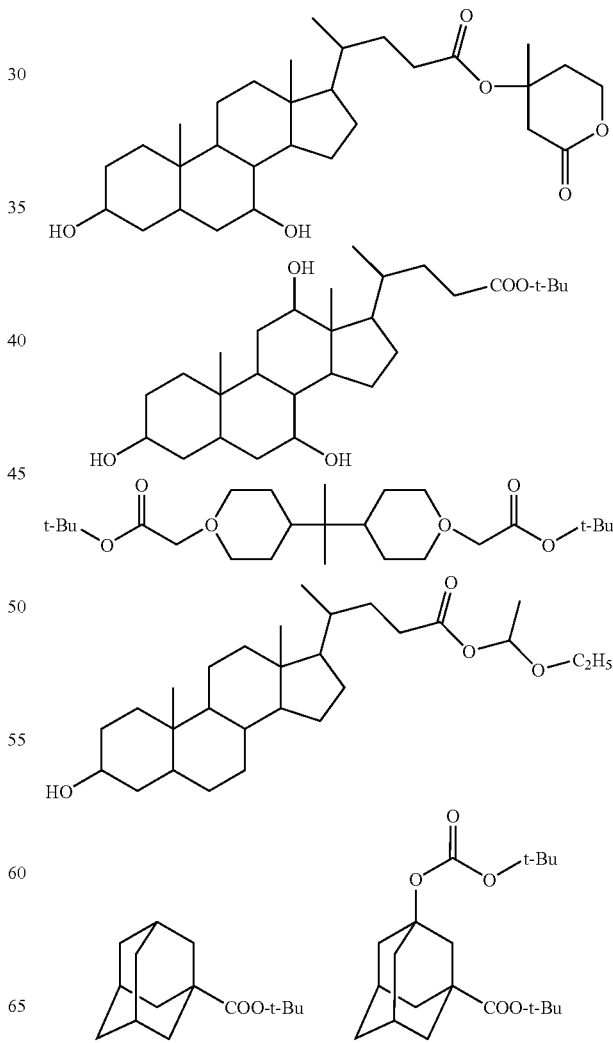

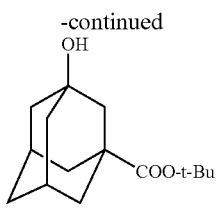

[7] Other Components Used in the Composition of the Present Invention

The resist composition of the present invention may further contain, if desired, a nitrogen-containing basic compound, a dye, a surfactant, a plasticizer, a photo-decomposable base compound, a photo-base generator and the like.

[7-1] (F) Nitrogen-containing basic Compound

The nitrogen-containing basic compound which can be used in the present invention is preferably a compound having basicity higher than that of phenol.

Preferred chemical environments include structures represented by the following formulae (A) to (E). Formulae (B) to (E) each may be a part of a ring structure.

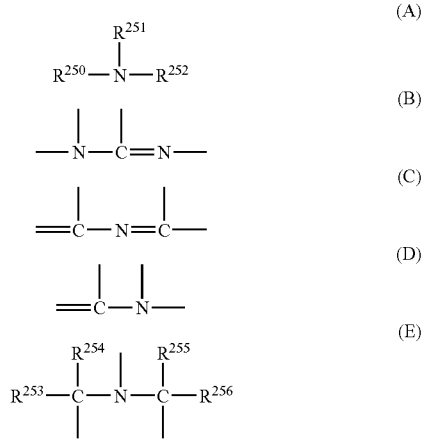

wherein $R^{250}$, $R^{251}$ and $R^{252}$ may be the same or different and each represents a hydrogen atom, an alkyl group having a carbon number of 1 to 6, an aminoalkyl group having a carbon number of 1 to 6, a hydroxyalkyl group having a carbon number of 1 to 6 or a substituted or unsubstituted aryl group having a carbon number of 6 to 20, and $R^{251}$ and $R^{252}$ may combine with each other to form a ring, and $R^{253}$, $R^{254}$, $R^{255}$ and $R^{256}$ may be the same or different and each represents an alkyl group having a carbon number of 1 to 6.

The compound is more preferably a nitrogen-containing basic compound having two or more nitrogen atoms different in the chemical environment within one molecule, still more preferably a compound containing both a substituted or unsubstituted amino group and a nitrogen atom-containing ring structure, or a compound having an alkylamino group.

Specific preferred examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, an imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethyl-pyridine, 4-aminoethylpyridine, 3-aminopyrrolidine, piperazine, N-(2-aminoethyl)piperazine, N-(2-aminoethyl)piperidine, 4-amino-2,2,6,6-tetramethyl-piperidine, 4-piperidinopiperidine, 2-iminopiperidine, 1-(2-aminoethyl)pyrrolidine, pyrazole, 3-amino-5-methyl-pyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine, however, the present invention is not limited thereto.

These nitrogen-containing basic compounds are used individually or in combination of two or more thereof.

The ratio of the acid generator (A) and the nitrogen-containing basic compound used in the composition is preferably (acid generator (A))/(nitrogen-containing basic compound) (molar ratio)=2.5 to 300. The molar ratio of not less than 2.5 is preferable in view of high sensitivity and resolution, whereas the molar ratio of not more than 300 is preferable in view that the thickening of the resist pattern can be prevented in aging after exposure until heat treatment and the resolution is high. The (acid generator (A))/(nitrogen-containing basic compound) (molar ratio) is more preferably from 5.0 to 200, still more preferably from 7.0 to 150.

[7-2] Dye

Suitable dyes include an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all are produced by Orient Chemical Industries Co., Ltd.), Crystal Violet (CI42555), Methyl Violet (CI42535), Rhodamine B (CI45170B), Malachite Green (CI42000) and Methylene Blue (CI52015).

(7-3] Solvents

The composition of the present invention is dissolved in a solvent capable of dissolving the above-described components and then coated on a support. The solvent used here is preferably ethylene dichloride, cyclohexanone, cyclopentanone, 2-heptanone, γ-butyrolactone, methyl ethyl ketone, ethylene. glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone, tetrahydrofuran or the like. These solvents are used individually or in combination.

[7-4] Surfactants

To this solvent, a surfactant may be added. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), polyoxyethylene/poly-oxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); a fluorine-containing or silicon-containing surfactant such as Eftop EF301, EF303, EF352 (all produced by Shin-Akita Kasei KK), Megafac F171, F173 (both produced by Dainippon Ink & Chemicals, Inc.), Florad FC430, FC431 (both produced by Sumitomo 3M Limited), Asahiguard AG710, Surflon S-382, SC101, SC102, SC103, SC104, SC105 and SC-106 (all produced by Asahi Glass Co., Ltd.) and TROYSOL S-366 (produced by Toroy Chemical); organosiloxane polymer KP-341 (produced by Shin-Etsu Chemical Co., Ltd.); and acrylic acid-base or methacrylic acid-base (co)polymer Polyflow No. 75 and No. 95 (both produced by Kyoeisha Yushi Kagaku Kogyo KK). The amount of the surfactant blended is usually 2 parts by weight or less, preferably 1 part by weight or less, per 100 parts by weight of the solid content in the composition of the present invention.

These surfactants may be used individually or some of these may be added in combination.

[7-5] Plasticizer

The plasticizer which can be used in the resist composition of the present invention includes compounds described in JP-A-4-212960, JP-A-8-262720, European Patents 735, 422, 416,873 and 439,371 and U.S. Pat. No. 5,846,690. Specific examples thereof include di(2-ethylhexyl) adipate, n-hexyl benzoate, di-n-octyl phthalate, di-n-butyl phthalate, benzyl-n-butyl phthalate and dihydroabietyl phthalate.

[7-6] Photodecomposable Base Compound

In the composition of the present invention, an ammonium salt such as tetramethyl ammonium hydroxide, tetra-n-butyl ammonium hydroxide and betaine described in JP-A-7-28247, European Patent 616,258, U.S. Pat. No. 5,525,443, JP-A-9-127700, European Patent 762,207 and U.S. Pat. No. 5,783,354 may be added. Also, a compound (photo-base) which decreases in the basicity upon exposure described in JP-A-5-232706, JP-A-6-11835, JP-A-6-242606, JP-A-6-266100, JP-A-7-333851, JP-A-7-333844, U.S. Pat. No. 5,663,035 and European Patent 677,788 may be added.

[7-7] Photo-Base Generator

Examples of the photo-base generator which can be added to the composition of the present invention include compounds described in JP-A-4-151156, JP-A-4-162040, JP-A-5-197148, JP-A-5-5995, JP-A-6-194834, JP-A-8-146608, JP-A-10-83079 and European Patent 622,682. Specific examples of the photo-base generator which can be suitably used include 2-nitrobenzyl carbamate, 2,5-dinitrobenzylcyclohexyl carbamate, N-cyclohexyl-4-methylphenylsulfonamide and 1,1-dimethyl-2-phenylethyl-N-isopropyl carbamate. The photo-base generator is used for the purpose of improving the resist profile or the like.

The resist composition of the present invention is coated on a substrate to form a thin layer. The thickness of this coated layer is preferably from 0.1 to 4.0 µm.

In the present invention, a commercially available inorganic or organic antireflection film may be used, if desired. Furthermore, an antireflection film may be coated on an upper layer of the resist.

The antireflection film used as a lower layer of the resist may be either an inorganic film (such as titanium, titanium dioxide, titanium nitride, chromium oxide, carbon and amorphous silicon) or an organic film comprising a light absorbent and a polymer material. The former requires equipment for the formation of film, such as vacuum evaporation apparatus, CVD apparatus and sputtering apparatus. Examples of the organic antireflection film include a film comprising a diphenylamine derivative and formaldehyde-modified melamine resin condensate, an alkali-soluble resin and a light absorbent described in JP-B-7-69611, a reaction product of a maleic anhydride copolymer and a diamine-type light absorbent described in U.S. Pat. No. 5,294,680, a film comprising a resin binder and a methylolmelamine-base heat crosslinking agent described in JP-A-6-118631, an acrylic resin-type antireflection film containing a carboxylic acid group, an epoxy group and a light absorbing group within the same molecule described in JP-A-6-118656, a film comprising methylolmelamine and a benzophenone-base light absorbent described in JP-A-8-87115, and a film obtained by adding a low molecular light absorbent to a polyvinyl alcohol resin described in JP-A-8-179509.

Also, the organic antireflection film may be a commercially available organic antireflection film such as DUV-30 Series and DUV-40 Series (produced by Brewer Science, Inc.), and AR-2, AR-3 and AR-5 (produced by Shipley Co., Ltd.).

In the production of a precision integrated circuit device, the step of forming a pattern on a resist film is performed by coating the resist composition of the present invention directly on a substrate (for example, a silicon/silicon dioxide-coated glass substrate or metal substrate) or on an antireflection film previously provided by coating on the substrate, irradiating it with excimer laser light or electron beams or using an X-ray image drawing apparatus, and then subjecting the resist film to heating, development, rinsing and drying, whereby a good resist pattern can be formed. As for the exposure light source used here, an apparatus using electron beam, X ray or EUV light as the exposure light source is suitably used.

The developer which can be used for the resist composition of the present invention is an aqueous solution of alkalis including inorganic alkalis such as sodium hydroxide, potassium hydroxide, sodium carbonate, sodium silicate, sodium metasilicate and aqueous ammonia, primary anines such as ethylamine and n-propylamine, secondary amines such as diethylamine and di-n-butylamine, tertiary amines such as triethylamine and methyldiethylamine, alcohol amines such as dimetylethanolamine and triethanolamine, quaternary ammonium salts such as tetramethylammonium hydroxide, tetraethylammonium hydroxide and choline, and cyclic amines such as pyrrole and piperidine. Furthermore, to this aqueous solution of alkalis, an alcohol such as isopropyl alcohol and a surfactant such as nonionic surfactant may be added each in an appropriate amount.

Among these developers, preferred are quaternary ammonium salts, more preferred are tetramethylammonium hydroxide and choline.

EXAMPLES

The present invention is described in greater detail below by referring to Examples, however, the present invention should not be construed as being limited thereto.

<Synthesis of Constituent Material>

(1) Acid Generator (A)

Synthesis Example 1

(Synthesis of Acid Generator (A-2)):

In 200 ml of methylene chloride, 17.6 g (80 mmol) of iodosyl benzene was added and stirred. To the obtained suspension solution, 14 ml (160 mmol) of trifluoromethanesulfonic acid was added dropwise and stirred for 3 hours. Furthermore, 6.24 g (80 mmol) of benzene was added dropwise and stirred for 2 hours. The obtained precipitate was filtered, washed with ether and dried and thereby 1,4-bis[phenyl[(trifluoromethanesulfonyl)oxy]iodo]benzene was obtained.

Then, 31.6 g (40 mmol) of 1,4-bis[phenyl[(trifluoromethanesulfonyl)oxy]iodo]benzene, 360 mg (2 mmol) of copper(II) acetate and 54.4 ml (330 mmol) of diphenylsulfide were suspended and stirred at 200° C. for 30 minutes. The resulting suspension was cooled to room temperature, washed with ether and dried to obtain Acid Generator (A-2).

(2) Alkali-Soluble Resin

Synthesis Example 1

(Synthesis of Alkali-Soluble Resin (29)):

In 30 ml of 1-methoxy-2-propanol, 3.9 g (0.024 mol) of 4-acetoxystyrene and 0.8 g (0.006 mol) of 4-methoxystyrene were dissolved. Thereto, 50 mg of 2,2'-azobis(2,4-dimethylvaleronitrile) (V-65, trade name, produced by Wako Pure Chemical Industries, Ltd.) as a polymerization initiator and 70 ml of a 1-methoxy-2-propanol solution containing 9.1 g (0.056 mol) of acetoxystyrene and 1.9 g (0.014 mol) of 4-methoxystyrene were added dropwise over 2 hours while stirring in a nitrogen stream. After 2 hours, 50 mg of the initiator was additionally added and the reaction was further performed for 2 hours. Thereafter, the stirring was continued for 1 hour while elevating the temperature to 90° C. The reaction solution was allowed to cool and then poured in 1 liter of ion exchanged water while vigorously stirring, as a result, a white resin was precipitated. The obtained resin was dried, then dissolved in 100 ml of methanol and after the acetoxy group in the resin was hydrolyzed by adding 25% tetramethylammonium hydroxide, neutralized with an aqueous hydrochloric acid solution to precipitate a white resin. The obtained resin was washed with ion exchanged water and then dried under reduced pressure to obtain 11.6 g of Alkali-Soluble Resin (29). The molecular weight was measured by GPC and found to be 9,200 in terms of the weight average molecular weight (Mw: polystyrene conversion). The degree of dispersion (Mw/Mn) was 2.2.

Alkali-soluble resins were synthesized in the same manner as above.

(3) Crosslinking Agent

Synthesis of [HM-1]:

To an aqueous 10% potassium hydroxide solution, 20 g of 1-[α-methyl-α-(4-hydroxyphenyl)ethyl)-4-[α,α-bis (4-hydroxyphenyl)ethyl]benzene (Trisp-PA, produced by Honshu Chemical Industry Co., Ltd.) was added and dissolved by stirring. To this solution, 60 ml of an aqueous 37% formalin solution was gradually added while stirring at room temperature over 1 hour. After further stirring at room temperature for 6 hours, the solution was poured in an aqueous dilute sulfuric acid solution. The precipitate was filtered, thoroughly washed with water and then recrystallized from 30 ml of methanol, as a result, 20 g of hydroxymethyl group-containing phenol derivative [HM-1] having the following structure was obtained as white powder. The purity was 92% (by liquid chromatography).

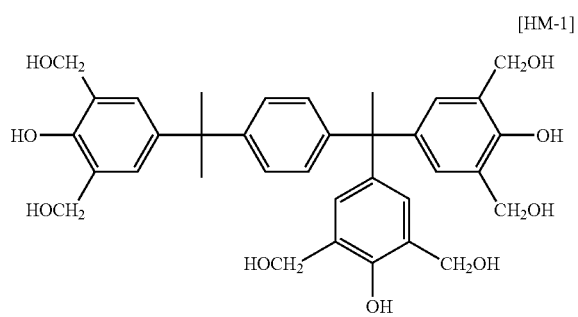

[HM-1]

Synthesis of (MM-1]:

To 1 liter of methanol, 20 g of hydroxymethyl group-containing phenol derivative [HM-1] obtained in the Synthesis Example above was added and dissolved by stirring under heat. To this solution, 1 ml of concentrated sulfuric acid was added and refluxed under heat for 12 hours. After the completion of reaction, the reaction solution was cooled and 2 g of potassium carbonate was added. The resulting mixture was sufficiently concentrated and thereto, 300 ml of ethyl acetate was added. The obtained solution was washed with water and then concentrated to dryness, as a result, 22 g of methoxymethyl group-containing phenol derivative [MM-1] having the following structure was obtained as a white solid. The purity was 90% (by liquid chromatography).

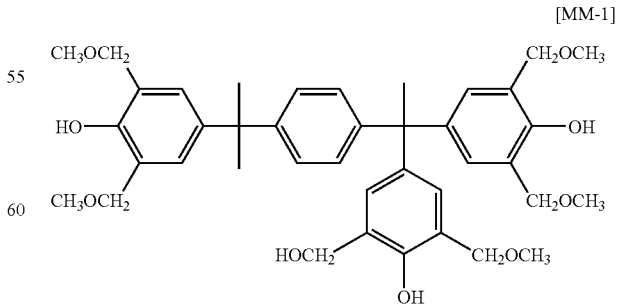

[MM-1]

Phenol derivatives shown below were synthesized in the same manner as above.

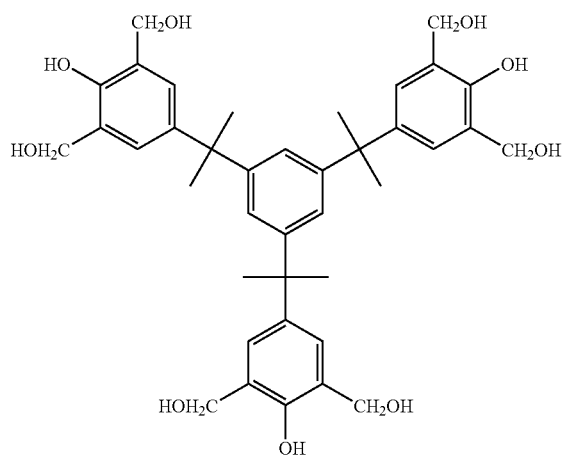
[HM-2]
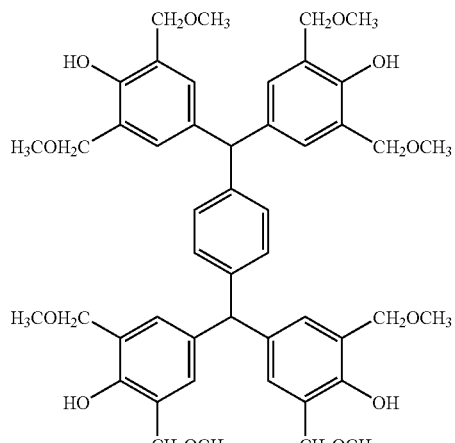
[MM-3]
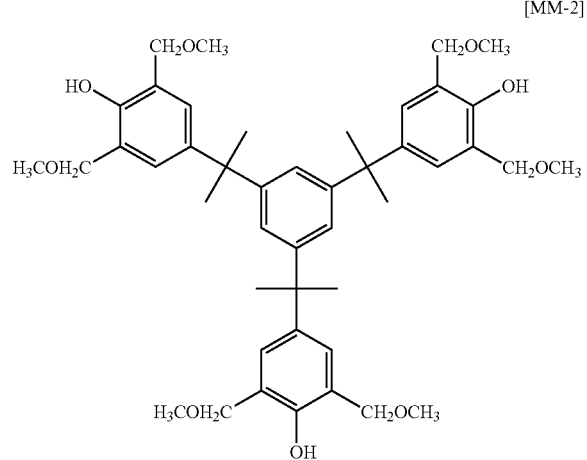
[MM-2]
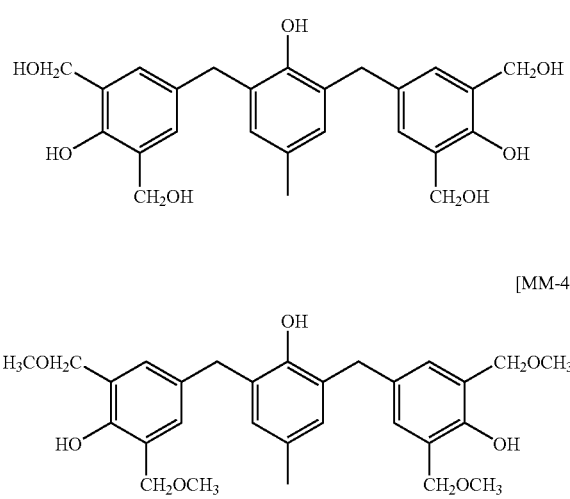
[HM-4]
[MM-4]
[MM-5]
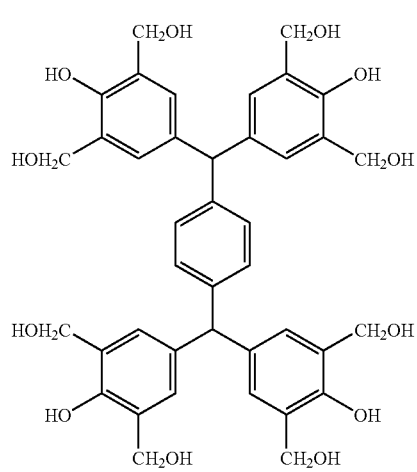
[HM-3]
(4) Acid Decomposable Resin
Synthesis Example 1
(Synthesis of Acid Decomposable Resin (R-20)):
In 300 ml of toluene, 83.1 g (0.5 mol) of p-cyclohexylphenol was dissolved and subsequently, 150 g of 2-chloroethyl vinyl ether, 25 g of sodium hydroxide, 5 g of tetrabutylammonium bromide and 60 g of triethylamine were added and reacted at 120° C. for 5 hours. The reaction solution was washed with water, excess chloroethyl vinyl ether and toluene were distilled off and the obtained oil was purified by distillation under reduced pressure to obtain 4-cyclohexylphenoxyethyl vinyl ether.

Subsequently, 20 g of poly(p-hydroxystyrene) (VP-8000, produced by Nippon Soda Co. Ltd.) and 6.5 g of 4-cyclohexylphenoxyethyl vinyl ether were dissolved in 80 ml of THF and thereto, 0.01 g of p-toluenesulfonic acid was added and reacted at room temperature for 18 hours. The reaction solution was dropwise added to 5 liter of distilled water while vigorously stirring and the powder precipitated was filtered and dried, as a result, Acid Decomposable Resin (R-20) was obtained.

Examples 1 to 25 and Comparative Examples 1 to 4

An alkali-soluble resin, an acid generator, a crosslinking agent, a nitrogen-containing basic compound and a surfactant were dissolved in a solvent as shown in Tables 1 to 3 below to prepare a solution and the solution obtained was microfiltered through a membrane filter having a pore size of 0.1 μm to obtain a negative resist so ution.

This negative resist solution was coated on a 6-inch wafer using a spin coater Mark 8 manufactured by Tokyo Electron Ltd. and dried on a hot plate at 110° C. for 90 seconds to obtain a resist film having a thickness of 0.3 μm.

This resist film was irradiated using an electron beam image drawing apparatus (HL750, manufactured by Hitachi, Ltd., accelerated voltage: 50 KeV). After the irradiation, the resist film was heated on a hot plate at 110° C. for 90 seconds, dipped in an aqueous solution of 2.38 wt % tetramethylammonium hydroxide (TMAH) for 60 seconds, rinsed with water for 30 seconds and dried. The obtained pattern was evaluated on the pattern profile and isolation performance by the following methods. The results obtained are shown in Tables 4 to 5.

<Pattern Profile>

The cross-sectional shape of a 0.15-μm line pattern at a minimum exposure amount on resolving 0.15 μm (line: space=1:1) was observed using a scanning electron microscope (S-4300, manufactured by Hitachi, Ltd.)

<Isolation Performance>

The threshold resolution of resolving an isolated line pattern (line:space=1:10) with a minimum exposure amount on resolving 0.15 μm (line:space=1:1) was designated as the isolation performance.

TABLE 1

| | Alkali-Soluble Resin, 0.70 g | Acid Generator | Cross-linking Agent | Nitrogen-Containing Basic Compound | Surfactant, 0.001 g | Solvent, 8.5 g |
|---|---|---|---|---|---|---|
| Example 1 | (27) Mw = 7500 x/y = 85/15 Mw/Mn = 1.7 | A-1 0.05 g | MM-1 0.25 g | OE-1 0.002 g | W-1 | S-1 8.5 g |
| Example 2 | (1) Mw = 11000 Mw/Mn = 1.4 | A-5 0.06 g | MM-1 0.25 g | OE-1 0.002 g | W-1 | S-1 7.5 g S-2 1.5 g |
| Example 3 | (29) Mw = 9200 x/y = 80/20 Mw/Mn = 2.2 | A-3 0.06 g | MM-1 0.25 g | OE-1 0.002 g | W-1 | S-1 8.5 g |
| Example 4 | (2) Mw = 6000 Mw/Mn = 1.12 | A-4 0.07 g | MM-2 0.20 g | OE-2 0.002 g | W-1 | S-1 5.0 g S-2 3.5 g |
| Example 5 | (93) Mw = 9000 x/y = 85/15 Mw/Mn = 1, 12 | A-2 0.06 g | MM-1 0.20 g | OE-3 0.002 g | — | S-1 5.5 g |
| Example 6 | (94) Mw = 12000 x/y = 90/10 Mw/Mn = 2.0 | A-6 0.04 g | MM-3 0.25 g | OE-3 0.002 g | W-2 | S-2 8.5 g |
| Example 7 | (96) Mw = 7000 x/y = 90/10 Mw/Mn = 2.2 | A-7 0.05 g | MM-4 0.30 g | OE-1 0.002 g | W-2 | S-1 7.0 g S-2 1.5 g |
| Example 8 | (15) Mw = 12800 Mw/Mn = 1.8 | A-9 0.07 g | MM-1 0.30 g | OE-1 0.002 g | W-1 | S-1 7.0 g S-2 1.5 g |
| Example 9 | (1) Mw = 15000 Mw/Mn = 1.4 | A-13 0.05 g | MM-1 0.25 | OE-2 0.002 g | W-1 | S-1 7.0 g S-2 1.5 g |
| Example 10 | (2) Mw = 9000 Mw/Mn = 1.6 | A-6 0.04 g | MM-1 0.25 g | OE-4 0.002 g | W-2 | S-1 7.0 g S-2 1.5 g |
| Example 11 | (25) Mw = 7800 x/y = 80/20 Mw/Mn = 1.9 | A-1 0.06 g | CL-1 0.25 g | OE-4 0.002 g | W-1 | S-1 8.5 g |
| Example 12 | (31) Mw = 10500 x/y = 90/10 Mw/Mn = 1.7 | A-19 0.09 g | MM-1 0.25 g | OE-4 0.002 g | W-1 | S-1 2.0 g S-2 6.5 g |

TABLE 2

| | Alkali-Soluble Resin, 0.70 g | Acid Generator | Cross-linking Agent | Nitrogen-Containing Basic Compound | Surfactant, 0.001 g | Solvent, 8.5 g |
|---|---|---|---|---|---|---|
| Example 13 | (32) Mw = 7500<br>x/y = 95/5<br>Mw/Mn = 2.0 | A-16 0.07 g | CL-1 0.25 g | OE-2 0.002 g | W-2 | S-1 7.0 g<br>S-2 1.5 g |
| Example 14 | (33) Mw = 4500<br>x/y = 90/10<br>Mw/Mn = 1.6 | A-15 0.05 g | CL-1 0.25 g | OE-2 0.002 g | W2 | S-1 7.0 g<br>S-2 1.5 g |
| Example 15 | (39) Mw = 8000<br>x/y = 85/15<br>Mw/Mn = 1.8 | A-17 0.04 g | MM-4 0.30 g | OE-3 0.002 g | W-2 | S-1 7.0 g<br>S-2 1.5 g |
| Example 16 | (28) Mw = 13500<br>x/y = 90/10<br>Mw/Mn = 1.5 | A-1 0.04 g | MM-4 0.30 g | OE-1 0.002 g | W-2 | S-1 8.5 g |
| Example 17 | (60) Mw = 9500<br>x/y/z = 90/5/5<br>Mw/Mn = 2.0 | A-1 0.07 g | MM-1 0.20 g | OE-3 0.002 g | W-1 | S-1 8.0 g<br>S-2 0.5 g |
| Example 18 | (41) Mw = 6000<br>x/y = 85/15<br>Mw/Mn = 1.35 | A-9 0.10 g | MM-3 0.25 g | OE-1 0.002 g | W-1 | S-1 7.0 g<br>S-2 1.5 g |
| Example 19 | (93) Mw = 9000<br>x/y = 85/15<br>Mw/Mn = 1.6 | A-19 0.07 g | MM-2 0.20 g | OE-2 0.002 g | W-2 | S-1 7.0 g<br>S-2 1.5 g |
| Example 20 | (97) Mw = 6800<br>Mw/Mn = 2.2 | A-8 0.04 g | MM-1 0.25 g | OE-1 0.002 g | W-2 | S-1 8.0 g<br>S-2 0.5 g |
| Example 21 | (1) Mw/Mn = 1000<br>Mw/Mn = 1.2 | A-20 0.06 g | MM-1 0.25 g | OE-1 0.002 g | W-2 | S-1 8.5 g |
| Example 22 | (95) Mw = 6500<br>x/y = 90/10<br>Mw/Mn = 1.9 | A-2 0.05 g | MM-1 0.05 g | OE-2 0.002 g | W-2 | S-1 7.0 g<br>S-2 1.5 g |
| Example 23 | (25) Mw = 7800<br>x/y = 80/20<br>Mw/Mn = 1.9 | A-1 0.03 g | CL-1 0.25 g | OE-4 0.002 g | W-1 | S-1 8.5 g |
| Example 24 | (95) Mw = 6500<br>x/y = 90/10<br>Mw/Mn = 1.9 | A-2 0.15 g | MM-1 0.25 g | OE-2 0.002 g | W-2 | S-1 7.0 g<br>S-2 1.5 g |
| Example 25 | (95) Mw = 6800<br>Mw/Mn = 2.2 | A-8 0.04 g | MM-1 0.25 g | — | W-2 | S-1 8.0 g<br>S-2 0.5 g |

TABLE 3

| | Alkali-Soluble Resin, 0.70 g | Acid Generator | Cross-linking Agent | Nitrogen-Containing Basic Compound | Surfactant, 0.001 g | Solvent, 8.5 g |
|---|---|---|---|---|---|---|
| Comparative Example 1 | (29) Mw = 9200<br>x/y = 80/20<br>Mw/Mn = 2.2 | Z-5 0.07 g | MM-1 0.25 g | OE-1 0.002 g | W-1 | S-1 8.5 g |
| Comparative Example 2 | (2) Mw = 15000<br>Mw/Mn = 1.4 | Z-9 0.06 g | MM-1 0.25 g | OE-2 0.002 g | W-1 | S-1 7.0 g<br>S-2 1.5 g |
| Comparative Example 3 | (2) Mw = 9000<br>Mw/Mn = 1.6 | Z-17 0.06 g | MM-4 0.25 g | — | W-2 | S-1 7.0 g<br>S-2 1.5 g |
| Comparative Example 4 | (1) Mw = 15000<br>Mw/Mn = 1.4 | Z-9 0.05 g<br>Z-10 0.02 g | MM-1 0.25 g | — | W-1 | S-1 7.0 g<br>S-2 1.5 g |

Symbols in Tables indicate the following compounds.
The structure of Crosslinking Agent CL-1 is shown below.

(Crosslinking Agent)

Cl-1:

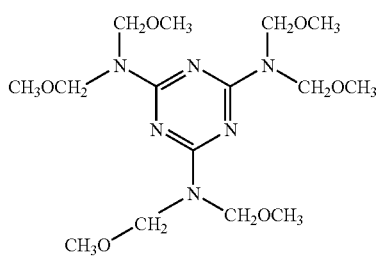

Nitrogen-containing basic compounds (all are produced by Tokyo Kasei Co., Ltd.) are as follows.
OE-1: 1,5-diazabicyclo(4.3.0)non-5-ene
OE-2: 2,4,5-triphenylimidazole
OE-3: 4-dimethylaminopyridine
OE-4: tri-n-butylamine Surfactants are as follows.
W-1: Megafac F176 (produced by Dainippon Ink and Chemicals, Inc.)
W-2: Siloxane polymer KP-341 (produced by Shin-Etsu Chemical Co., Ltd.)

Solvents are as follows.
S-1: propylene glycol monomethyl ether acetate
S-2: propylene glycol monomethyl ether

TABLE 4

|  | Pattern Profile | Resolution of Isolated Line Pattern (line:space = 1:1) (μm) |
|---|---|---|
| Example 1 | rectangular | 0.050 |
| Example 2 | rectangular | 0.050 |
| Example 3 | rectangular | 0.050 |
| Example 4 | rectangular | 0.050 |
| Example 5 | rectangular | 0.055 |
| Example 6 | rectangular | 0.050 |
| Example 7 | rectangular | 0.050 |
| Example 8 | rectangular | 0.050 |
| Example 9 | rectangular | 0.050 |
| Example 10 | rectangular | 0.050 |
| Example 11 | rectangular | 0.050 |
| Example 12 | rectangular | 0.050 |
| Example 13 | rectangular | 0.050 |
| Example 14 | rectangular | 0.050 |

TABLE 4-continued

|  | Pattern Profile | Resolution of Isolated Line Pattern (line:space = 1:1) (μm) |
|---|---|---|
| Example 15 | rectangular | 0.050 |
| Example 16 | rectangular | 0.050 |
| Example 17 | rectangular | 0.050 |
| Example 18 | rectangular | 0.050 |
| Example 19 | rectangular | 0.050 |
| Example 20 | rectangular | 0.050 |
| Example 21 | rectangular | 0.050 |
| Example 22 | rectangular | 0.050 |
| Example 23 | slightly bottom-tailing | 0.060 |
| Example 24 | reverse tapering | 0.060 |
| Example 25 | rectangular | 0.070 |

TABLE 5

|  | Pattern Profile | Resolution of Isolated Line Pattern (line:space = 1:1) (μm) |
|---|---|---|
| Comparative Example 2 | round top | 0.100 |
| Comparative Example 2 | round top | 0.105 |
| Comparative Example 3 | round top + bottom-tailing | 0.180 |
| Comparative Example 4 | round top + bottom-tailing | 0.180 |

It is seen from Tables 4 and 5 that the negative resist composition according to the present invention has excellent performance ensuring good pattern profile and good isolation.

Examples 26 to 40 and Comparative Examples 5 to 8

An acid decomposable resin, an acid generator, a nitrogen-containing basic compound and a surfactant were dissolved in a solvent as shown in Tables 6 and 7 below to prepare a solution and the solution obtained was microfiltered through a membrane filter having a pore size of 0.1 μm to obtain a positive resist solution.

Using the obtained positive resist solution, a resist film was formed in the same manner as in Example 1 and evaluated on the pattern profile and isolation performance. The results obtained are shown in Table 8.

TABLE 6

|  | Acid Decomposable Resin, 0.70 g | Acid Generator | Nitrogen-Containing Basic Compound | Surfactant, 0.001 g | Solvent, 8.5 g |
|---|---|---|---|---|---|
| Example 26 | R-23 Mw = 8000 x/y/z = 10/70/20 Mw/Mn = 1.21 | A-5 0.06 g | OE-1 0.002 g | W-1 | S-1 8.5 g |
| Example 27 | R-24 Mw = 9000 x/y/z = 70/25/5 Mw/Mn = 1.51 | A-4 0.05 g | OE-1 0.002 g | W-1 | S-1 7.5 g S-2 1.5 g |
| Example 28 | R-17 Mw = 8000 x/y/z = 10/70/20 Mw/Mn = 2.05 | A-3 0.05 g | OE-1 0.002 g | W-1 | S-1 8.5 g |

TABLE 6-continued

| | Acid Decomposable Resin, 0.70 g | Acid Generator | Nitrogen-Containing Basic Compound | Surfactant, 0.001 g | Solvent, 8.5 g |
|---|---|---|---|---|---|
| Example 29 | R-13 Mw = 6000 x/y = 75/25 Mw/Mn = 1.10 | A-5 0.07 g | OE-4 0.002 g | W-1 | S-1 5.0 g S-2 3.5 g |
| Example 30 | R-2 Mw = 9000 x/y = 75/25 Mw/Mn = 1.23 | A-2 0.06 g | OE-3 0.002 g | — | S-1 8.5 g |
| Example 31 | R-8 Mw = 12000 x/y/z = 70/20/10 Mw/Mn = 1.13 | A-6 0.05 g | OE-3 0.002 g | W-2 | S-2 8.5 g |
| Example 32 | R-20 Mw = 7000 x/y = 85/15 Mw/Mn = 2.2 | A-1 0.05 g | OE-1 0.002 g | W-2 | S-1 7.0 g S-2 1.5 g |
| Example 33 | R-21 Mw = 7000 x/y = 75/25 Mw/Mn = 1.13 | A-1 0.10 g | OE-1 0.002 g | W-2 | S-1 7.0 g S-2 1.5 g |
| Example 34 | R-22 Mw = 4000 x/y = 70/30 Mw/Mn = 2.50 | A-19 0.06 g | OE-2 0.002 g | W-1 | S-1 8.5 g |
| Example 35 | R-14 Mw = 5000 x/y = 75/25 Mw/Mn = 1.15 | A-4 0.05 g | OE-1 0.002 g | W-2 | S-1 8.5 g |
| Example 36 | R-14 Mw = 2500 x/y = 59/41 Mw/Mn = 1.15 | A-2 0.06 g | OE-1 0.002 g | W-2 | S-1 8.5 g |
| Example 37 | R-17 Mw = 5000 x/y/z = 10/70/20 Mw/Mn = 1.25 | A-20 0.05 g | OE-1 0.002 g | W-1 | S-1 8.5 g |
| Example 38 | R-14 Mw = 11000 x/y = 91/9 Mw/Mn = 1.30 | A-2 0.06 g | OE-1 0.002 g | W-2 | S-1 8.5 g |
| Example 39 | R-23 Mw = 8000 x/y/z = 10/70/20 Mw/Mn = 1.21 | A-2 0.15 g | OE-1 0.002 g | W-1 | S-1 8.5 g |
| Example 40 | R-23 Mw = 8000 x/y/z = 1.0/70/20 Mw/Mn = 1.21 | A-8 0.04 g | OE-1 0.002 g | W-1 | S-1 8.5 g |

TABLE 7

| | Acid Decomposable Resin, 0.70 g | Acid Generator | Nitrogen-Containing Basic Compound | Surfactant, 0.001 g | Solvent, 8.5 g |
|---|---|---|---|---|---|
| Comparative Example 5 | R-23 Mw = 8000 x/y/z = 10/70/20 Mw/Mn = 1.22 | Z-1 0.06 g | OE-2 0.002 g | W-1 | S-1 8.5 g |
| Comparative Example 6 | R-23 Mw = 8000 x/y/z = 10/70/20 Mw/Mn = 1.21 | Z-9 0.06 g | OE-1 0.002 g | W-2 | S-4 8.5 g |
| Comparative Example 7 | R-23 Mw = 8000 x/y/z = 10/70/20 Mw/Mn = 1.21 | Z-9 0.06 g | — | W-1 | S-1 8.5 g |
| Comparative Example 8 | R-23 Mw = 8000 x/y/z = 10/70/20 Mw/Mn = 1.22 | Z-9 0.05 g Z-10 0.02 g | — | W-1 | S-1 8.5 g |

TABLE 8

| | Pattern Profile | Resolution of Isolated Reverse Line Pattern (line:space = (1:10) (µm) |
|---|---|---|
| Example 26 | rectangular | 0.060 |
| Example 27 | rectangular | 0.060 |
| Example 28 | rectangular | 0.050 |
| Example 29 | rectangular | 0.050 |
| Example 30 | rectangular | 0.050 |
| Example 31 | rectangular | 0.050 |
| Example 32 | rectangular | 0.050 |
| Example 33 | rectangular | 0.060 |

TABLE 8-continued

| | Pattern Profile | Resolution of Isolated Reverse Line Pattern (line:space = (1:10) (μm) |
|---|---|---|
| Example 34 | rectangular | 0.060 |
| Example 35 | rectangular | 0.050 |
| Example 36 | slightly reverse tapering | 0.055 |
| Example 37 | slightly bottom-tailing | 0.055 |
| Example 38 | slightly bottom-tailing | 0.055 |
| Example 39 | reverse tapering | 0.065 |
| Example 40 | slightly bottom-tailing | 0.065 |
| Comparative Example 5 | slightly bottom-tailing | 0.100 |
| Comparative Example 6 | slightly bottom-tailing | 0.100 |
| Comparative Example 7 | bottom-tailing | 0.110 |
| Comparative Example 8 | bottom-tailing | 0.125 |

It is seen from Table 8 that the positive resist composition of the present invention is excellent in the pattern profile and isolation performance.

According to the present invention, a resist composition ensuring excellent pattern profile and excellent isolation performance can be provided for the pattern formation by the irradiation of actinic rays or radiation, particularly, electron beam, X ray or EUV light.

The entire disclosure of each and every foreign patent application from which the benefit of foreign priority has been claimed in the present application is incorporated herein by reference, as if fully set forth.

What is claimed is:

1. A positive resist composition comprising:
   (A) a compound generating an acid upon irradiation with actinic rays or radiation, the compound having: a partial structure represented by the following formula (1); and a counter ion; and
   (D) a resin capable of increasing in the solubility in an alkali developer under the action of an acid,
   wherein the composition comprises the compound (A) in an amount of from 3.6 to 15 wt % based on the solid content of the composition:

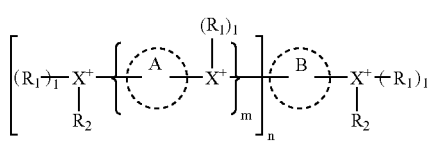

(1)

wherein X represents a sulfur atom or an iodine atom and the plurality of Xs may be the same or different, $R_1$ and $R_2$ each independently represents an alkyl group which may have a substituent, or an aryl group which may have a substituent; when a plurality of $R_1$s are present, the plurality of $R_1$s may be the same or different; the plurality of $R_2$s may be the same or different; and $R_1$ and $R_2$ may combine to form a ring, A and B each independently represents a hydrocarbon structure connecting between $X^+$s, and at least two of $X^+$s connected with B are in a conjugated system; and when a plurality of As are present, the plurality of As may be the same or different, l represents 0 or 1, and, when X is a sulfur atom, l parenthesizing $R_1$ connected to $X^+$ is 1 and when X is an iodine atom, l parenthesizing $R_1$ connected to $X^+$ is 0, m represents an integer of 0 to 10, and n represents an integer of 1 to 5.

2. The positive resist composition as claimed in claim 1, wherein the resin (D) is (D1) a resin capable of increasing in the solubility in an alkali developer under the action of an acid, the resin (D1) having a repeating unit represented by the following formula (IV) and a repeating unit represented by the following formula (V):

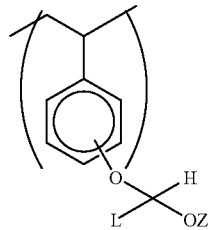

(IV)

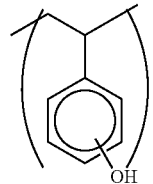

(V)

wherein L represents a hydrogen atom, a linear, branched or cyclic alkyl group which may be substituted, or an aralkyl group which may be substituted, Z represents a linear, branched or cyclic alkyl group which may be substituted, or an aralkyl group which may be substituted, and Z and L may combine to form a 5- or 6-membered ring.

3. The positive resist composition as claimed in claim 2, wherein the molar ratio of the repeating unit represented by formula (IV) to the repeating unit represented by formula (V) is (IV)/(V)=10/90 to 40/60.

4. The positive resist composition as claimed in claim 1, which further comprises (F) a nitrogen-containing basic compound.

5. The positive resist composition as claimed in claim 1, wherein the counter ion in the compound (A) is one of an anion of an aliphatic sulfonic acid and an anion of an aromatic sulfonic acid.

6. The positive resist composition as claimed in claim 5, wherein the anion of an aliphatic sulfonic acid and an anion of an aromatic sulfonic acid contain a fluorine atom as a substituent.

7. The positive resist composition as claimed in claim 1, wherein in the formula (1), B is a benzene ring, n is 1 and m is 0.

8. The positive resist composition as claimed in claim 1, wherein in the formula (1), the hydrocarbon structure of A is a hydrocarbon structure having: from 4 to 16 carbon atoms; a single bond consisting of (carbon-carbon) bond; and one of a double bond and a triple bond, and the hydrocarbon structure may have an oxygen atom or a sulfur atom.

9. The positive resist composition as claimed in claim 1, wherein in the formula (1), the hydrocarbon structure of B is a conjugated hydrocarbon structure having: from 4 to 16 carbon atoms; a single bond (carbon-carbon) bond; and one of a double bond and a triple bond, and the hydrocarbon structure may have an oxygen atom or a sulfur atom.

10. The positive resist composition as claimed in claim 1, wherein in the formula (1), the hydrocarbon structure of A is one of the followings:

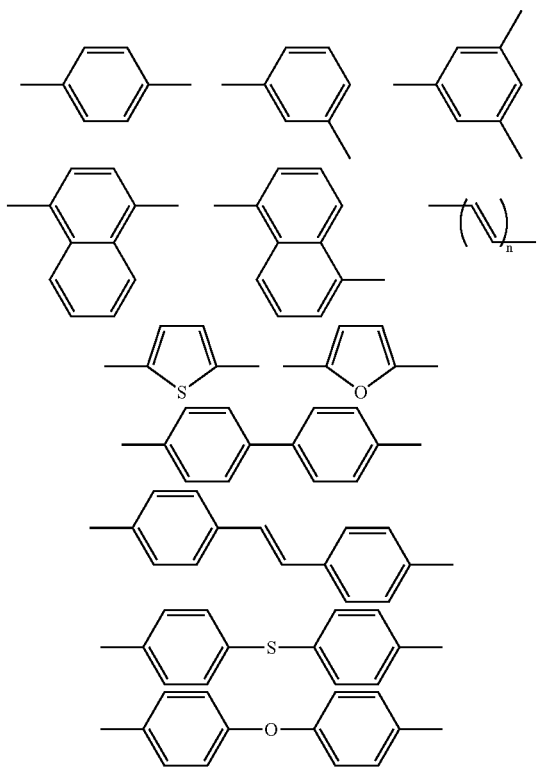

11. The positive resist composition as claimed in claim 1, wherein in the formula (1), the hydrocarbon structure of B is one of the followings:

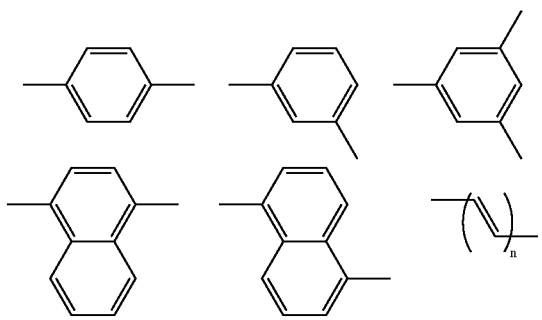

-continued

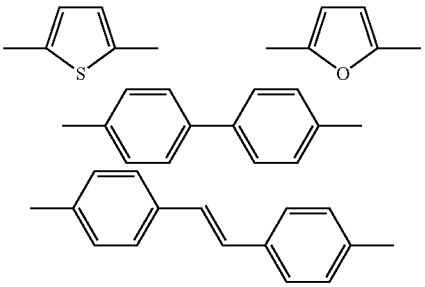

12. A positive resist composition comprising:

(A) a compound generating an acid upon irradiation with actinic rays or radiation, the compound having: a partial structure represented by the following formula (1); and a counter ion;

(B) an alkali-soluble resin; and (C) a compound capable of increasing in the solubility in an alkali developer under the action of an acid, wherein the composition comprises the compound (A) in an amount of from 3.6 to 15 wt % based on the solid content of the composition:

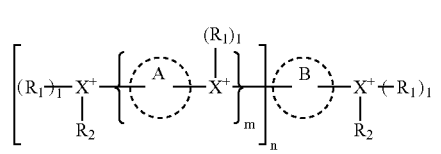

(1)

wherein X represents a sulfur atom or an iodine atom and the plurality of Xs may be the same or different, $R_1$ and $R_2$ each independently represents an alkyl group which may have a substituent, or an aryl group which may have a substituent; when a plurality of $R_1$s are present, the plurality of $R_1$s may be the same or different; the plurality of $R_2$s may be the same or different; and $R_1$ and $R_2$ may combine to form a ring, A and B each independently represents a hydrocarbon structure connecting between $X^+$s, and at least two of $X^+$s connected with B are in a conjugated system; and when a plurality of As are present, the plurality of As may be the same or different, l represents 0 or 1, and, when X is a sulfur atom, l parenthesizing $R_1$ connected to $X^+$ is 1 and when X is an iodine atom, l parenthesizing $R_1$ connected to $X^+$ is 0, m represents an integer of 0 to 10, and n represents an integer of 1 to 5.

* * * * *